(12) United States Patent
Liu et al.

(10) Patent No.: US 10,923,523 B2
(45) Date of Patent: Feb. 16, 2021

(54) MULTI-PHOTODIODE PIXEL CELL

(71) Applicant: Facebook Technologies, LLC, Menlo Park, CA (US)

(72) Inventors: Xinqiao Liu, Medina, WA (US); Song Chen, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/384,720

(22) Filed: Apr. 15, 2019

(65) Prior Publication Data

US 2019/0319061 A1 Oct. 17, 2019

Related U.S. Application Data

(60) Provisional application No. 62/658,056, filed on Apr. 16, 2018.

(51) Int. Cl.
*H01L 27/146* (2006.01)
*H04N 5/357* (2011.01)
(Continued)

(52) U.S. Cl.
CPC ...... *H01L 27/14643* (2013.01); *G02B 27/017* (2013.01); *G06F 3/012* (2013.01);
(Continued)

(58) Field of Classification Search
CPC ............. H01L 27/14643; H01L 27/148; H01L 27/14609; H01L 27/14647; H01L 27/1461;
(Continued)

(56) References Cited

U.S. PATENT DOCUMENTS 8,134,623 B2 3/2012 Purcell et al.
8,779,346 B2 7/2014 Fowler et al.
(Continued)

FOREIGN PATENT DOCUMENTS

EP 1746820 A1 1/2007
WO 2017069706 A1 4/2017

OTHER PUBLICATIONS

U.S. Appl. No. 15/847,517, "Non-Final Office Action", dated Nov. 23, 2018, 21 pages.
(Continued)

*Primary Examiner* — Hsien Ming Lee
(74) *Attorney, Agent, or Firm* — Kilpatrick Townsend & Stockton

(57) ABSTRACT

In one example, an apparatus comprises: a first photodiode configured to convert a first component of light to a first charge, second photodiode configured to convert a second component of the light to a second charge; and an interface circuit configured to: perform a first quantization and a second quantization of the first charge to generate, respectively, a first result and a second result, the first quantization and the second quantization being associated with different light intensity ranges; provide one of the first result or the second result to represent an intensity of the first component of a pixel; perform the first quantization and the second quantization of the second charge to generate, respectively, a third result and a fourth result; and provide one of the third result or the fourth result to represent an intensity of the second component of the pixel.

20 Claims, 26 Drawing Sheets

(51) Int. Cl.
*G06F 3/01* (2006.01)
*G02B 27/01* (2006.01)
*H01L 27/148* (2006.01)

(52) U.S. Cl.
CPC ...... *H01L 27/148* (2013.01); *H01L 27/14609* (2013.01); *H04N 5/357* (2013.01); *G02B 2027/0178* (2013.01)

(58) Field of Classification Search
CPC .............. H01L 27/14652; G06F 3/012; G02B 2027/0178; G02B 27/0093; H04N 5/33; H04N 5/37457; H04N 5/3559; H04N 9/04553; H04N 9/04557
See application file for complete search history.

(56) References Cited

U.S. PATENT DOCUMENTS

| | | |
|---|---|---|
| 9,094,629 B2 | 7/2015 | Ishibashi |
| 9,185,273 B2 | 11/2015 | Beck et al. |
| 9,363,454 B2 | 6/2016 | Ito et al. |
| 2003/0020100 A1 | 1/2003 | Guidash |
| 2004/0251483 A1 | 12/2004 | Ko et al. |
| 2005/0057389 A1 | 3/2005 | Krymski |
| 2007/0076481 A1 | 4/2007 | Tennant |
| 2007/0102740 A1 | 5/2007 | Ellis-Monaghan et al. |
| 2007/0222881 A1 | 9/2007 | Mentzer |
| 2009/0224139 A1 | 9/2009 | Buettgen et al. |
| 2010/0140732 A1 | 6/2010 | Eminoglu et al. |
| 2010/0276572 A1 | 11/2010 | Iwabuchi et al. |
| 2011/0050351 A1 | 5/2011 | Koo et al. |
| 2011/0254986 A1 | 10/2011 | Nishimura et al. |
| 2012/0092677 A1 | 4/2012 | Suehira et al. |
| 2012/0133807 A1 | 5/2012 | Wu et al. |
| 2012/0241591 A1 | 9/2012 | Wan et al. |
| 2012/0262616 A1 | 10/2012 | Sa et al. |
| 2013/0056809 A1 | 3/2013 | Mao et al. |
| 2013/0057742 A1 | 3/2013 | Nakamura et al. |
| 2013/0113969 A1 | 5/2013 | Manabe et al. |
| 2013/0141619 A1 | 6/2013 | Lim et al. |
| 2013/0207219 A1 | 8/2013 | Ahn |
| 2013/0234029 A1 | 9/2013 | Bikumandla |
| 2013/0299674 A1 | 11/2013 | Fowler et al. |
| 2014/0021574 A1 | 1/2014 | Egawa |
| 2014/0042299 A1 | 2/2014 | Wan et al. |
| 2014/0306276 A1 | 10/2014 | Yamaguchi |
| 2015/0189209 A1 | 7/2015 | Yang et al. |
| 2015/0279884 A1 | 10/2015 | Kusumoto |
| 2015/0312502 A1 | 10/2015 | Borremans |
| 2015/0350582 A1 | 12/2015 | Korobov et al. |
| 2015/0358569 A1 | 12/2015 | Egawa |
| 2016/0028974 A1 | 1/2016 | Guidash et al. |
| 2016/0088253 A1 | 3/2016 | Tezuka |
| 2016/0093659 A1 | 3/2016 | Nakamura et al. |
| 2016/0100115 A1 | 4/2016 | Kusano |
| 2016/0111457 A1 | 4/2016 | Sekine |
| 2016/0165160 A1 | 6/2016 | Hseih et al. |
| 2016/0204150 A1 | 7/2016 | Oh et al. |
| 2016/0240570 A1 | 8/2016 | Bama et al. |
| 2016/0337605 A1 | 11/2016 | Ito |
| 2016/0360127 A1 | 12/2016 | Dierickx et al. |
| 2017/0013215 A1 | 1/2017 | McCarten |
| 2017/0207268 A1 | 7/2017 | Kurokawa |
| 2017/0366766 A1 | 12/2017 | Geurts et al. |
| 2018/0019269 A1 | 1/2018 | Klipstein |
| 2019/0172868 A1* | 6/2019 | Chen .................. H01L 27/1461 |
| 2019/0348460 A1 | 11/2019 | Chen et al. |
| 2019/0371845 A1 | 12/2019 | Chen et al. |

OTHER PUBLICATIONS

Cho, et al., "A Low Power Dual CDS for a Column-Parallel CMOS Image Sensor", Journal of Semiconductor Technology and Science, vol. 12, No. 4, Dec. 30, 2012, pp. 388-396.
European Application No. EP18179838.0, "Partial European Search Report", dated Dec. 5, 2018, 14 pages.
European Application No. EP18179846.3, "Extended European Search Report", dated Dec. 7, 2018, 10 pages.
European Application No. EP18179851.3, "Extended European Search Report", dated Dec. 7, 2018, 8 pages.
International Application No. PCT/US2018/039350, "International Search Report and Written Opinion", dated Nov. 15, 2018, 13 pages.
International Application No. PCT/US2018/039352, "International Search Report and Written Opinion", dated Oct. 26, 2018, 10 pages.
International Application No. PCT/US2018/039431, "International Search Report and Written Opinion", dated Nov. 7, 2018, 14 pages.
International Application No. PCT/US2018/064181, "International Search Report and Written Opinion", dated Mar. 29, 2019, 12 pages.
International Application No. PCT/US2019/027727, International Search Report and Written Opinion dated Jun. 27, 2019, 11 pages.
Final Office Action for U.S. Appl. No. 16/210,748 dated Jul. 7, 2020, 11 pages.
Non-Final Office Action for U.S. Appl. No. 16/210,748 dated Jan. 31, 2020, 11 pages.
Notice of Allowance for U.S. Appl. No. 16/435,449 dated Jul. 27, 2020, 8 pages.
Notice of Allowance for U.S. Appl. No. 16/435,449 dated Sep. 16, 2020, 7 pages.
Non-Final Office Action for U.S. Appl. No. 16/436,049 dated Jun. 30, 2020, 11 pages.
Non-Final Office Action for U.S. Appl. No. 16/436,049 dated Mar. 4, 2020, 9 pages.
International Search Report and Written Opinion for PCT Application No. PCT/US2019/031521 dated Jul. 11, 2019, 11 pages.
International Search Report and Written Opinion for PCT Application No. PCT/US2019/036492 dated Sep. 25, 2019, 9 pages.
International Search Report and Written Opinion for PCT Application No. PCT/US2019/036536 dated Sep. 26, 2019, 14 pages.
Non-Final Office Action for U.S. Appl. No. 16/407,072, dated Dec. 24, 2020, 15 pages.
Advisory Action for U.S. Appl. No. 16/210,748, dated Oct. 8, 2020, 4 pages.
Notice of Allowance for U.S. Appl. No. 16/436,049, dated Oct. 21, 2020, 8 pages.

* cited by examiner

MULTI-PHOTODIODE PIXEL CELL

RELATED APPLICATIONS

This patent application claims priority to U.S. Provisional Patent Application Ser. No. 62/658,056, filed Apr. 16, 2018, entitled "STACKED RGB-IR DIGITAL PIXEL SENSOR," which is assigned to the assignee hereof and are incorporated herein by reference in their entirety for all purposes.

BACKGROUND

The disclosure relates generally to image sensors, and more specifically to pixel cell that includes multiple photodiodes.

A typical pixel in an image sensor includes a photodiode to sense incident light by converting photons into charge (e.g., electrons or holes). The charge can be temporarily stored in photodiode during an exposure period. For improved noise and dark current performances, a pinned photodiode can be included in the pixel to convert the photons into charge. The pixel may further include a capacitor (e.g., a floating diffusion) to collect the charge from the photodiode and to convert the charge to a voltage. An image of a scene can be derived from the voltages developed at the capacitors of an array of pixels.

SUMMARY

The present disclosure relates to image sensors. More specifically, and without limitation, this disclosure relates to an image sensor having an array of pixel cells. In some embodiments, each pixel cell includes a first photodiode, a second photodiode, and an interface circuit. The first photodiode is configured to convert a first component of light to first charge. The second photodiode is configured to convert a second component of the light to second charge. The interface circuit can perform a first quantization and a second quantization of the first charge to generate, respectively, a first result and a second result, the first quantization being associated with a first intensity range and the second quantization being associated with a second intensity range. The interface circuit can provide, based on an intensity range of the first component, one of the first result or the second result to represent the first component of a pixel. The interface circuit can also perform the first quantization and the second quantization of the second charge to generate, respectively, a third result and a fourth result. The interface circuit can also provide, based on an intensity range of the second component, one of the third result or the fourth result to represent the second component of the pixel.

In some examples, an apparatus is provided. The apparatus comprises: a first photodiode configured to convert a first component of light to a first charge; a second photodiode configured to convert a second component of the light to a second charge; and an interface circuit configured to: perform a first quantization and a second quantization of the first charge to generate, respectively, a first result and a second result, the first quantization being associated with a first intensity higher than an intensity threshold and the second quantization being associated with a second intensity lower than the intensity threshold; provide, based on whether an intensity of the first component exceeds the intensity threshold, one of the first result or the second result to represent an intensity of the first component of a pixel; perform the first quantization and the second quantization of the second charge to generate, respectively, a third result and a fourth result; and provide, based on whether an intensity of the second component exceeds the intensity threshold, one of the third result or the fourth result to represent an intensity of the second component of the pixel.

In one aspect, the first photodiode and the second photodiode form a stack structure in a semiconductor substrate along an axis parallel with a direction of propagation of the light within the semiconductor substrate such that (a) the light traverses the second photodiode to reach the first photodiode, or (b) the light traverses the first photodiode to reach the second photodiode.

In one aspect, the apparatus is a back-side illuminated device. The first component of the light is within an infra-red wavelength range. The second component of the light is within a visible light wavelength range.

In one aspect, the apparatus is a front-side illuminated device. The first component of the light is within a visible light wavelength range. The second component of light is within an infra-red wavelength range.

In one aspect, the apparatus further comprises a charge storage device coupled with the first photodiode. The first photodiode is configured to store first residual charge, the first residual charge being part of the first charge generated by the first photodiode. The charge storage device is configured to store first overflow charge, the first overflow charge being part of the first charge generated by the first photodiode if an intensity of the first component of the light exceeds the intensity threshold. The first quantization is configured to measure a quantity of the first overflow charge. The second quantization is configured to measure a quantity of the first residual charge.

In one aspect, the first photodiode is along a charge transfer path from the second photodiode to the charge storage device. The interface circuit is configured to control the second photodiode to transfer the second charge to the first photodiode to enable the first photodiode to store the second charge as second residual charge, and to enable the charge storage device to store part of the second charge as second overflow charge if an intensity of the second component of the light exceeds the intensity threshold. The first quantization is configured to measure a quantity of the second overflow charge. The second quantization is configured to measure a quantity of the second residual charge.

In one aspect, the semiconductor substrate includes a barrier layer sandwiched between the first photodiode and the second photodiode to control a flow of charge from the second photodiode to the first photodiode.

In one aspect, the barrier layer is configured to control the flow of charge from the second photodiode to the first photodiode based on at least one of: a first bias voltage applied to the barrier layer, or a second bias voltage applied to the semiconductor substrate.

In one aspect, the first photodiode is configured to store a first maximum quantity of the first residual charge. The second photodiode is configured to store a second maximum quantity of the second residual charge. The second maximum quantity is larger than the first maximum quantity.

In one aspect, the second maximum quantity is configured based on a maximum intensity of the second component of the light to be measured by the apparatus.

In one aspect, the first photodiode is configured to have a first quantum well capacity; the second photodiode is configured to have a second quantum well capacity larger than the first quantum well capacity; the first maximum quantity is configured based on the first quantum well capacity; and the second maximum quantity is configured based on the second quantum well capacity.

In one aspect, the second maximum quantity is configured based on an electrical potential applied to the semiconductor substrate.

In one aspect, the interface circuit further comprises: a counter configured to output count values based on a clock signal; a comparator configured to compare a voltage of the charge storage device against one or more thresholds to generate a decision; and a memory coupled with the counter and with the comparator, the memory being controlled based on the decision of the comparator to store a count value from the counter. The first result, the second result, the third result, and the fourth result are generated based on the stored count value.

In one aspect, the interface circuit is configured to perform the first quantization comprising: comparing, using the comparator, a first voltage at the charge storage device with a ramping threshold to generate a first decision indicative of whether the charge storage device stores the first overflow charge or the second overflow charge; and based on the first decision, controlling the memory to store a first count value from the counter as the first result of the first quantization of the first charge or as the third result of the first quantization of the second charge.

In one aspect, the interface circuit is configured to perform the second quantization comprising: transferring the first residual charge or the second residual charge from the first photodiode to the charge storage device to develop a second voltage at the charge storage device; comparing, using the comparator, the second voltage with a ramping threshold to generate a second decision; and based on the second decision, and based on the first decision indicating that the charge storage device does not store the first overflow charge nor the second overflow charge, controlling the memory to store a second count value from the counter as the second result of the second quantization of the first charge or as the fourth result of the second quantization of the second charge.

In one aspect, the interface circuit is configured to, prior to the first quantization: compare, using the comparator, the first voltage with a static threshold to generate a third decision indicative of whether the first overflow charge saturates the charge storage device; and based on the third decision indicating that the first overflow charge saturates the charge storage device: measure, based on a third count value from the counter, a time-to-saturation of the charge storage device; control the memory to store the third count value; control the memory not to store the first count value or the second count value; and provide the third count value stored in the memory to represent the intensity of the first component of a pixel.

In one aspect, the first photodiode and the second photodiode are pinned photodiodes.

In some examples, a method is provided. The method comprises: converting, using a first photodiode, a first component of light to a first charge; converting, using a second photodiode, a second component of the light to a second charge; performing a first quantization and a second quantization of the first charge to generate, respectively, a first result and a second result, the first quantization being associated with a first intensity higher than an intensity threshold and the second quantization being associated with a second intensity lower than the intensity threshold; providing, based on whether an intensity of the first component exceeds the intensity threshold, one of the first result or the second result to represent an intensity of the first component of a pixel; performing the first quantization and the second quantization of the second charge to generate, respectively, a third result and a fourth result; and providing, based on whether an intensity of the second component exceeds the intensity threshold, one of the third result or the fourth result to represent an intensity of the second component of the pixel.

BRIEF DESCRIPTION OF THE DRAWINGS

Illustrative embodiments are described with reference to the following figures.

Figure 1A:
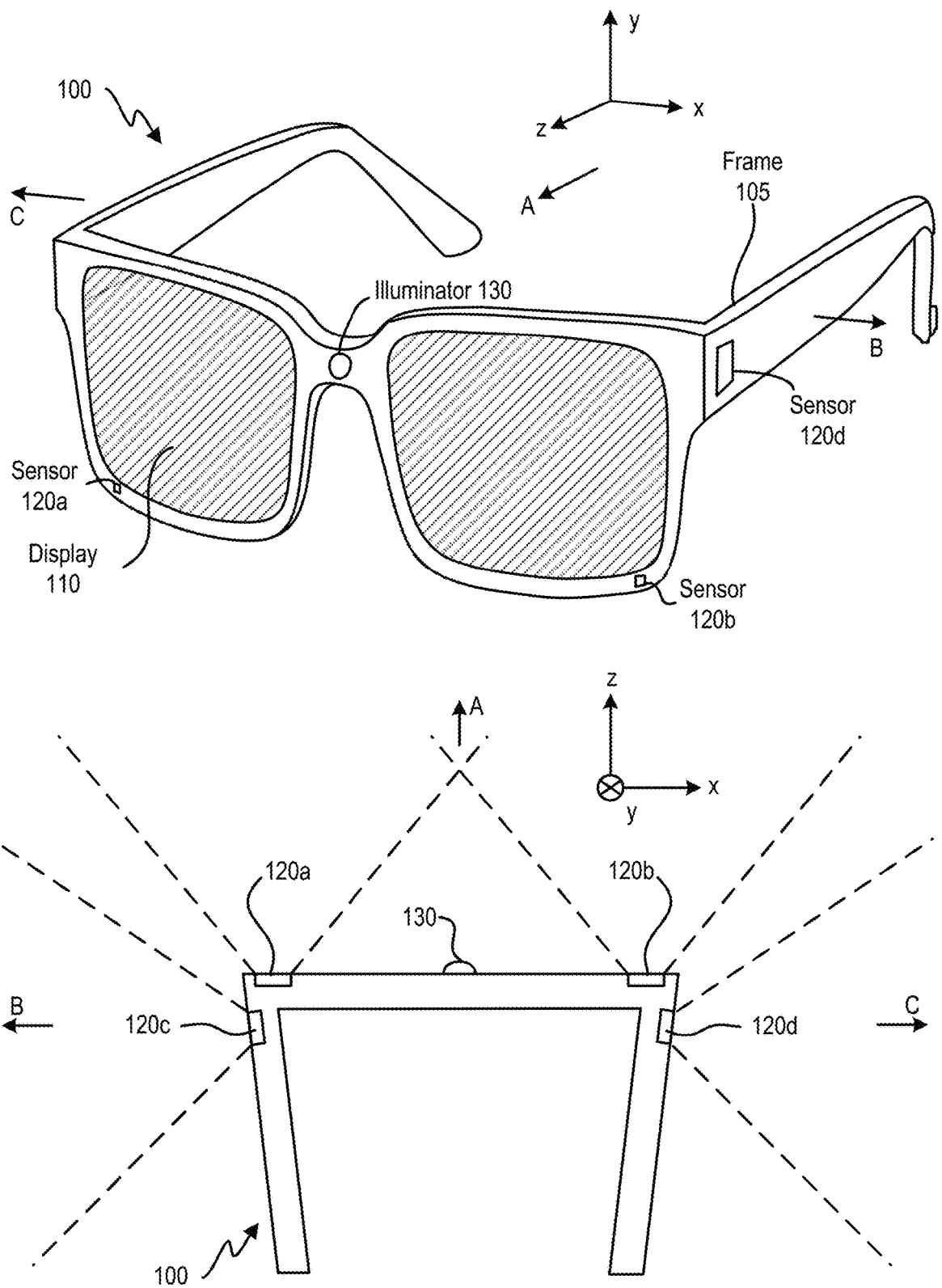
FIG. 1A and FIG. 1B are diagrams of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor typically includes an array of pixel cells. Each pixel cell may have a photodiode to sense incident light by converting photons into charge (e.g., electrons or holes). For improved noise and dark current performances, a pinned photodiode can be included in the pixel to convert the photons into charge. The charge can be temporarily stored in the photodiode during an exposure period. Each pixel cell may also include a floating diffusion node to convert the charge to a voltage. A pixel value can be generated based on the voltage. The pixel value can represent an intensity of light received by the pixel cell. An image comprising an array of pixels can be derived from the digital outputs of the voltages output by an array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, and blue colors) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, a subset (e.g., a first set) of the pixel cells within the array can be used to perform 2D sensing of the scene, and another subset (e.g., a second set) of the pixel cells within the array can be used to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Using different sets of pixel for 2D and 3D imaging, however, can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges (for 2D and 3D imaging) are not collocated, different pixel cells may capture information of different spots of a scene, which can complicate the mapping between 2D and 3D images. For example, a pixel cell that receives a certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption.

The present disclosure relates to an image sensor having an array of pixel cells. Each pixel cell can include a first photodiode, a second photodiode, and an interface circuit. The first photodiode is configured to convert a first component of light to a first charge. The second photodiode is configured to convert a second component of the light to a second charge. Both the first photodiode and the second photodiode can be pinned photodiodes. The interface circuit can perform a first quantization and a second quantization of the first charge to generate, respectively, a first result and a second result, the first quantization being associated with a first intensity range and the second quantization being associated with a second intensity range. The interface circuit can provide, based on an intensity range of the first component, one of the first result or the second result to represent the first component for a pixel. The interface circuit can also perform the first quantization and the second quantization of the second charge to generate, respectively, a third result and a fourth result. The interface circuit can also provide, based on an intensity range of the second component, one of the third result or the fourth result to represent the second component for the pixel.

Specifically, each pixel cell has a light receiving surface to receive incident light. The first photodiode and the second photodiode can form a stack structure along an axis perpendicular to the light receiving surface and each photodiode is separated from the light receiving surface by different distances, which enables the first photodiode and the second photodiode to convert different components of the incident light to charge. The first photodiode may be positioned further away from the light receiving surface than the second photodiode and can convert infra-red light component of the incident light to first charge for 3D imaging. The second photodiode can convert visible light component of the incident light (e.g., one of red, green, or blue colors) to second charge for 2D imaging.

Each pixel cell further includes a charge storage device, which can be a configurable capacitor comprising a floating drain (FD) and an auxiliary capacitor (e.g., a metal capacitor). The charge storage device, together with the quantum wells of the first photodiode and the second photodiode, provide storage of the first charge and the second charge for read-out and quantization. Specifically, the first photodiode may store the first charge as first residual charge in its quantum well if the first component of the light is within a low intensity range. If the first component is within a medium and high intensity range, the first charge may saturate the quantum well, and the rest of the first charge can overflow to the charge storage device as first overflow charge. Moreover, the second photodiode can store the entirety of the second charge. The apparatus further includes a barrier layer between the first photodiode and the second photodiode to prevent the first charge from flowing from the first photodiode into the second photodiode. As to be described below, the barrier layer can also regulate the flow of the second charge from the second photodiode to the first photodiode.

For measurement of the first component, the barrier layer can be controlled to prevent the flow of the second charge from the second photodiode to the first photodiode. For measurement of the first component in the medium and high intensity ranges, the capacity of the charge storage device can be increased (e.g., by connecting the floating drain and the auxiliary capacitor in parallel). Interface circuit can quantize the first overflow charge stored in the expanded charge storage device to generate a first result. For measurement of the first component in the low intensity range, the interface can reset the charge storage device, reduce the capacity of the charge storage device (e.g., by disconnecting the auxiliary capacitor from the floating drain), and then transfer the first residual charge from the first photodiode to the storage device. The interface circuit can quantize the first residual charge (now stored in the charge storage device) to generate a second result. The interface circuit can determine, based on whether the first photodiode saturates, the intensity range of the first component, and select one of the first result or the second result to represent the intensity of the first component for a pixel.

For both measurements of low and medium intensity ranges, the interface circuit may quantize, respectively, a quantity of the first residual charge and a quantity of the first overflow charge by comparing a voltage representing each quantity with a ramping threshold. A code representing the closest threshold to the voltage can be output to represent the intensity of the first component of the pixel. As to be described below, the quantization of the voltage representing the quantity of first residual charge can be performed in a "PD ADC" operation, whereas the quantization of the voltage representing the quantity of the first overflow charge can be performed in a "FD ADC" operation. For measurement of a high intensity range, the first overflow charge may saturate the charge storage device. The interface circuit can perform a time-to-saturation (TTS) measurement to measure the time it takes for the charge storage device to saturate, and provide the TTS measurement as output to represent the intensity of the first component of the pixel.

Following the read out and quantization of the first charge, the interface circuit can reset the first photodiode and the charge storage device, and then control the barrier layer to enable the transfer of the second charge from the second photodiode to the first photodiode. Depending on the quantity of the second charge (which reflects the intensity of the second component), as well as the quantum well capacity of the first photodiode, the second charge can be stored entirely in the first photodiode as second residual charge, or can overflow to the charge storage device as second overflow charge. Following the transfer, the interface circuit can perform the PD ADC operation on the second overflow charge to generate a third result, and perform the FD ADC operation on the second residual charge to generate a fourth result. Depending on whether the first photodiode saturates, the interface circuit can provide one of the third result or the fourth result to represent the intensity of the second component for the pixel.

With examples of the present disclosure, a pixel cell can use pinned photodiodes to perform photon-to-charge conversion for 2D and 3D imaging operations. As pinned photodiodes can provide superior performance in terms of dark current and noise, the pixel cell can measure light of low intensity more accurately, which can improve the image sensor's sensitivity and performance in an environment with low light intensity. Moreover, having the same set of pixel cells to perform both 2D and 3D sensing can facilitate the correspondence between a 2D image and a 3D image generated by the pixel cells, especially where the pinned photodiodes of each pixel cell detect and measure light of different wavelengths simultaneously within the same exposure period. Moreover, given that every pixel cell of a pixel cell array can be used to generate the 2D or 3D image, the full spatial resolution of the pixel cell array can be utilized. As a result, the spatial resolutions of the images can also be improved, while the form factor and power consumption of the image sensor can be reduced.

In addition, the different quantization operations for different intensity ranges (e.g., TTS for a high intensity range, FD ADC for a medium intensity range, PD ADC for a low intensity range, etc.) can expand the dynamic range of image sensor. For example, by performing TTS of the voltage at the charge storage, rather than measuring the voltage itself, the measurement result can still be linearly related to the light intensity even when the charge storage device saturates and when the voltage at the charge storage device no longer changes with the light intensity, and the upper limit of measurable light intensity can be increased. Moreover, by measuring the residual charge in the PD ADC mode for low intensity range, the effect of dark current on the measurement can be reduced, as the residual charge is accumulated at the photodiode and is subject to less dark current. Moreover, by reducing the capacitance of the charge storage device in the PD ADC mode, the charge-to-voltage conversion rate can be increased, which can improve the sensitivity of the quantization process and reduce the effect of quantization noise, and the lower limit of measurable light intensity can be further reduced. All these can expand the dynamic range as well as the range of applications of the image sensor.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HIVID, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel cell array comprising an array of pixel cells and configured to generate image data representing different fields of views along different directions. For example, sensors 120a and 120b may be configured to provide image data representing two field of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120a-120d in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more details below, sensors 120a-120d can be operated in a first mode for 2D sensing and in a second mode for 3D sensing at different times. The 2D and 3D image data can be merged and provided to a system to provide a more robust tracking of, for example, the location of the user, the head movement of the user, etc.

Figure 1B:
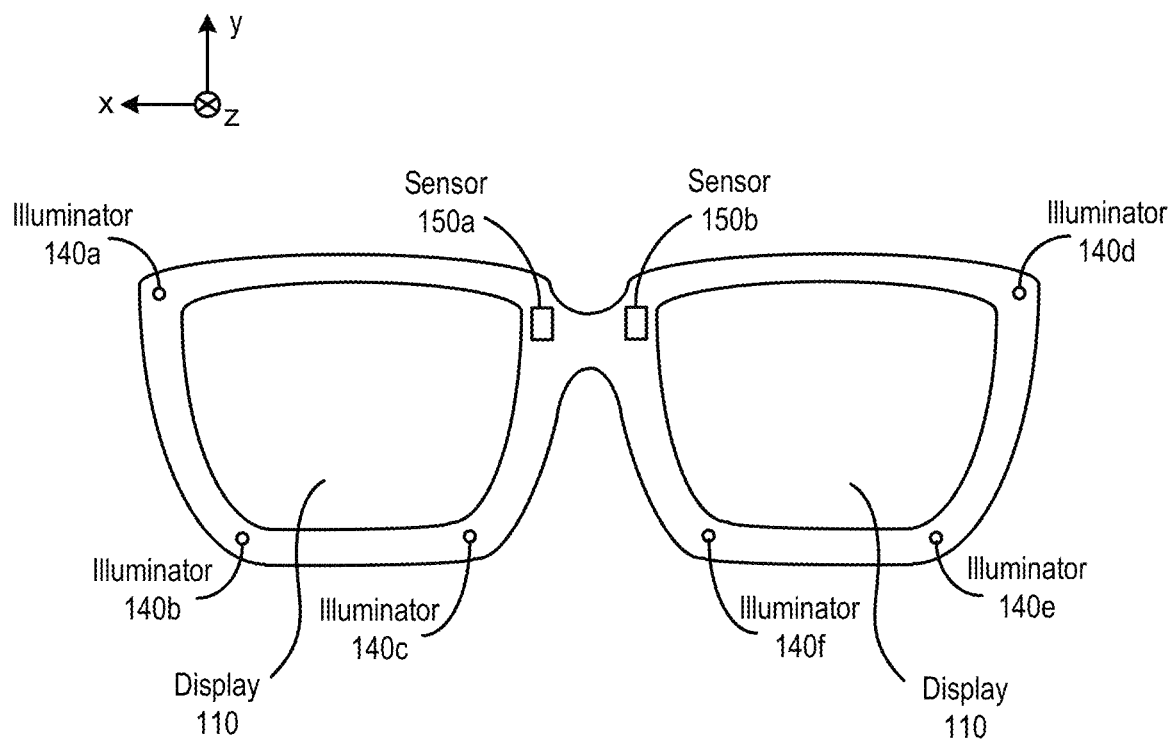

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain optical frequency range (e.g., NIR) towards direction D (which is opposite to direction A of FIG. 1A). The emitted light may be associated with a certain pattern, and can be reflected by the left eyeball of the user. Sensor 150a may include a pixel cell array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel cell array to generate an image of the reflected pattern. Based on the images of the reflected pattern from sensors 150a and 150b, the system can determine a gaze point of the user, and update the image data provided to display 100 based on the determined gaze point to provide an interactive experience to the user. In some examples, image sensors 150a and 150b may include same pixel cells as sensors 120a-120d.

Figure 1B:
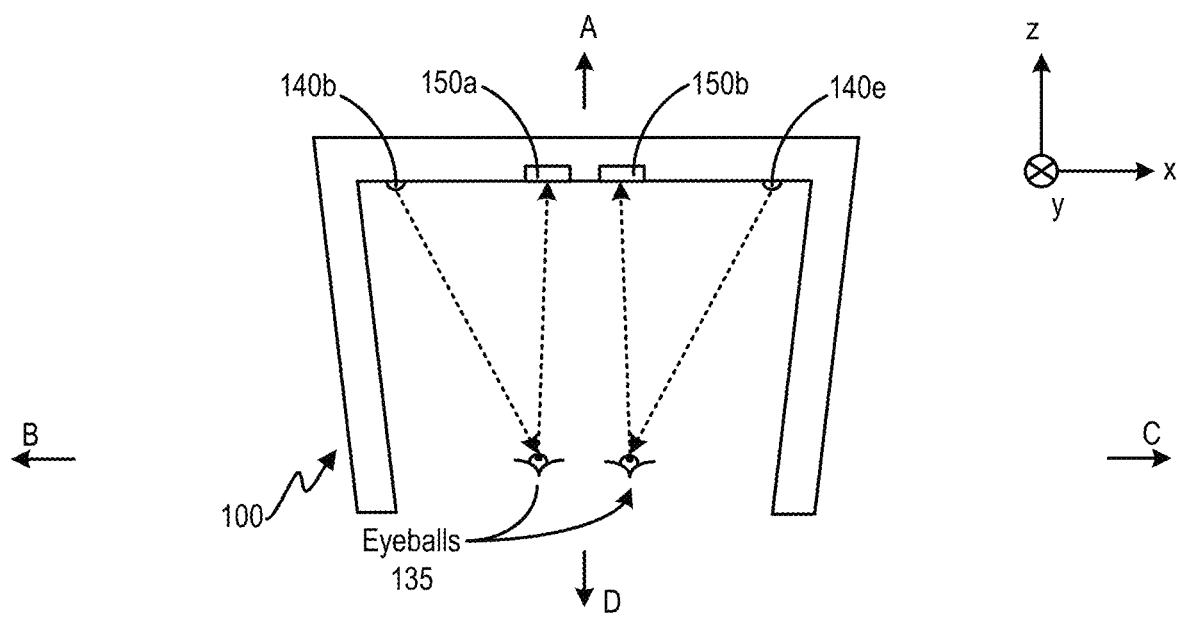
Figure 2:
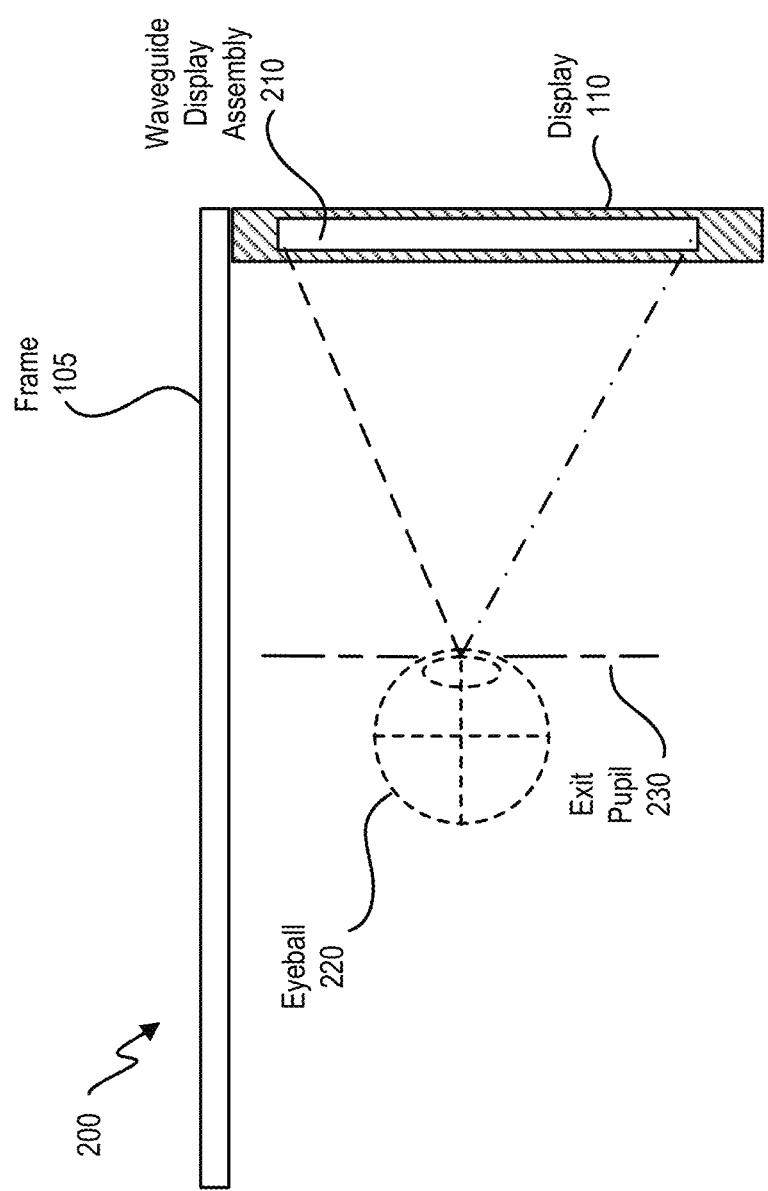
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
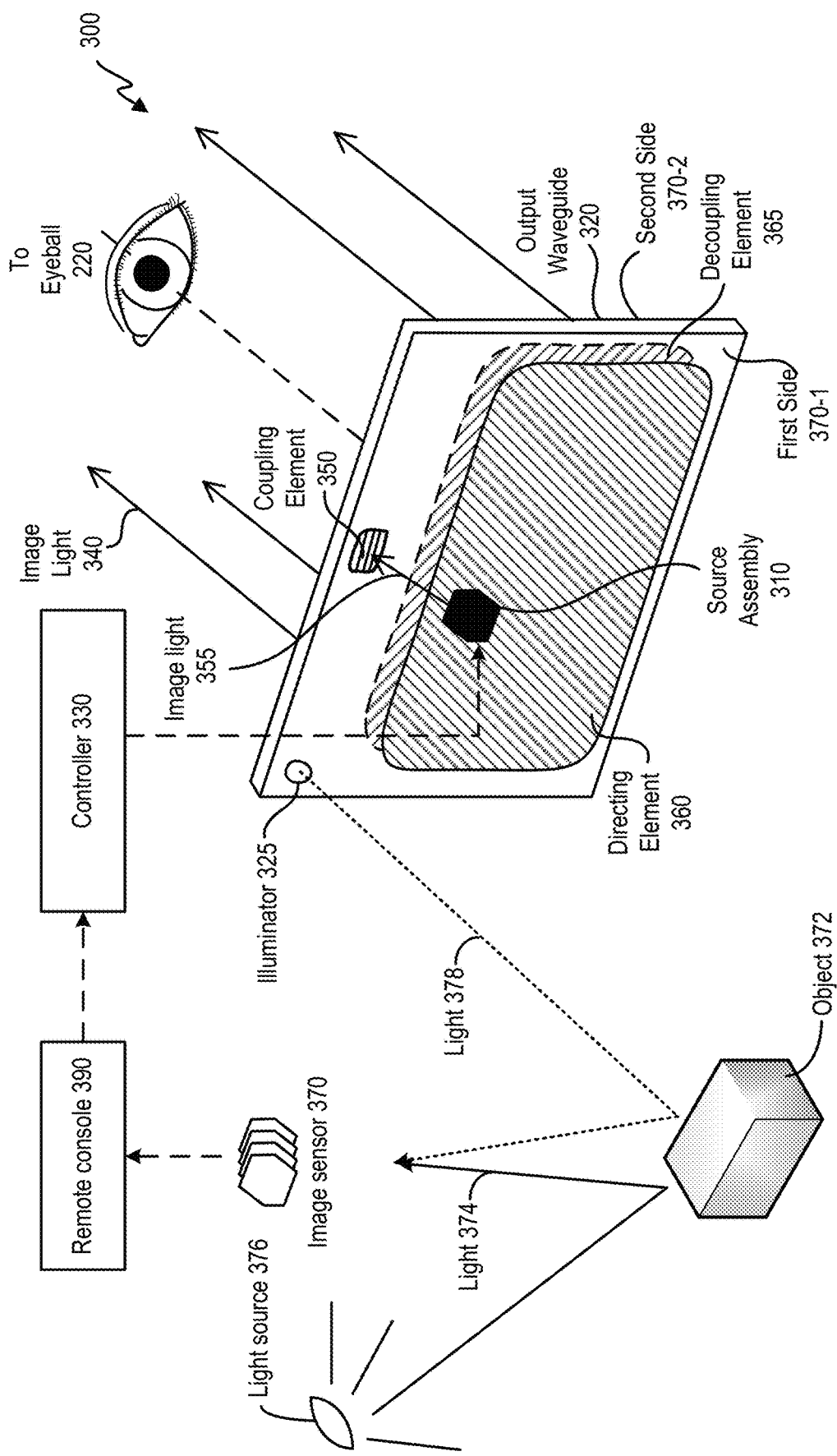
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
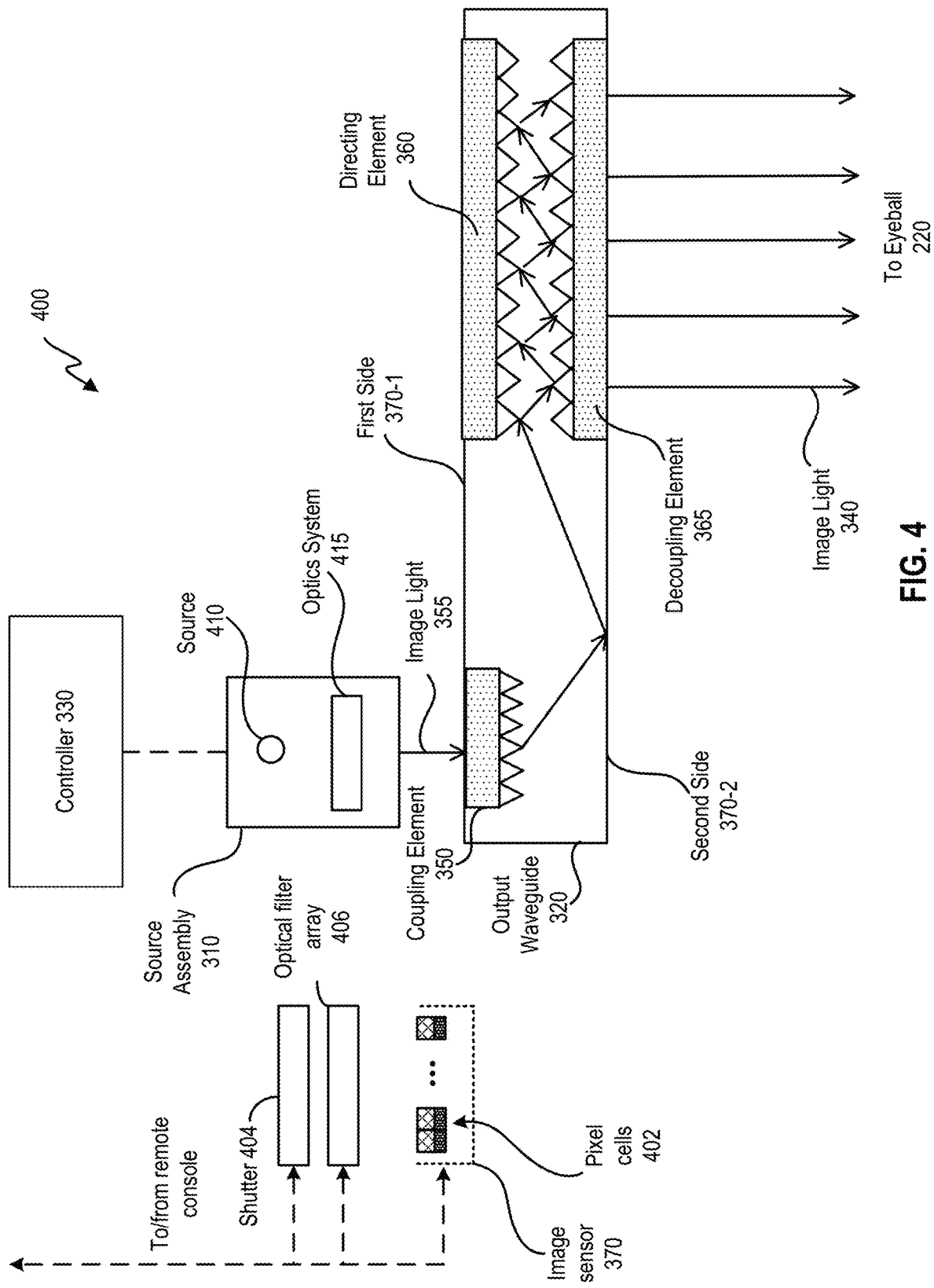
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
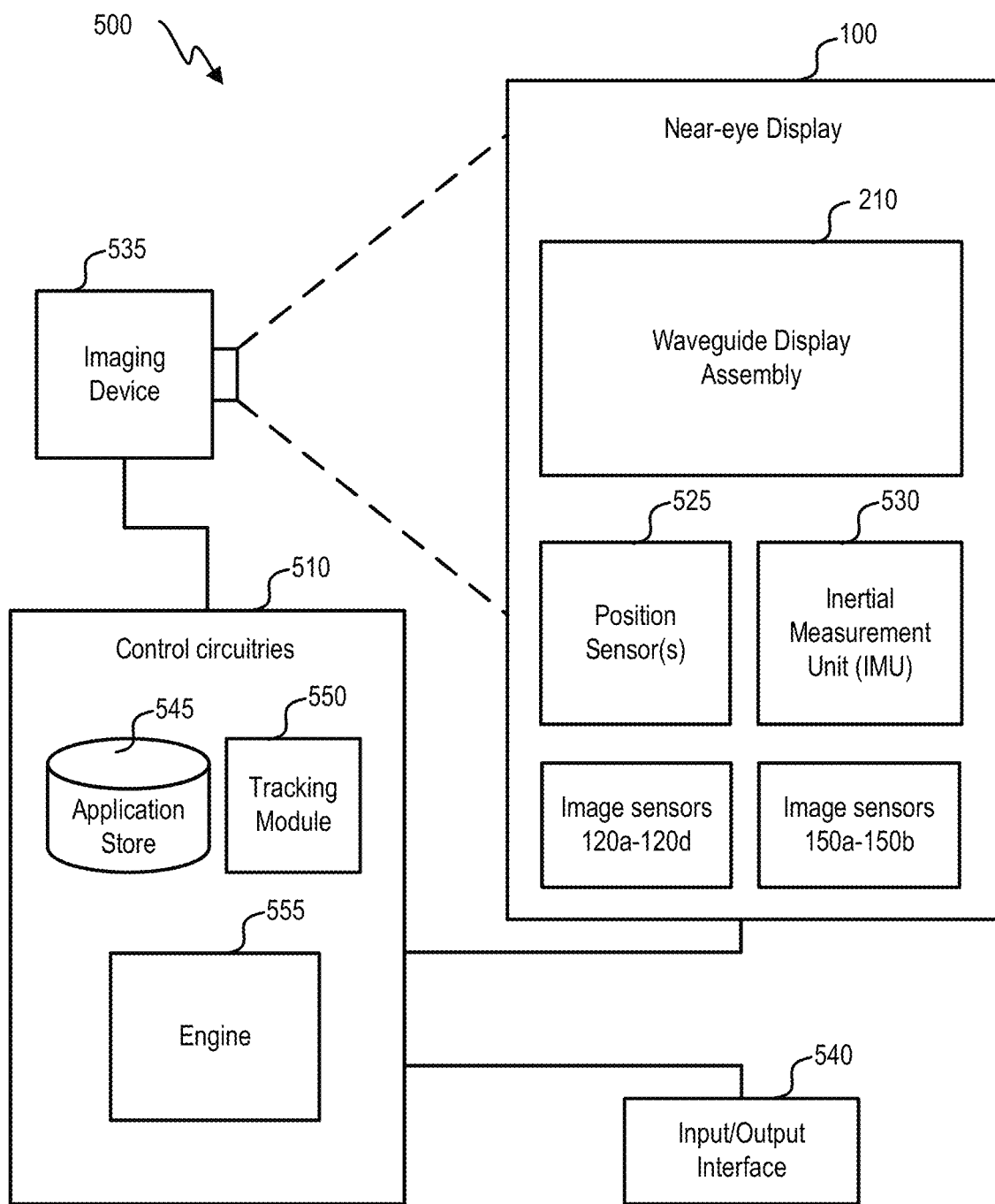
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
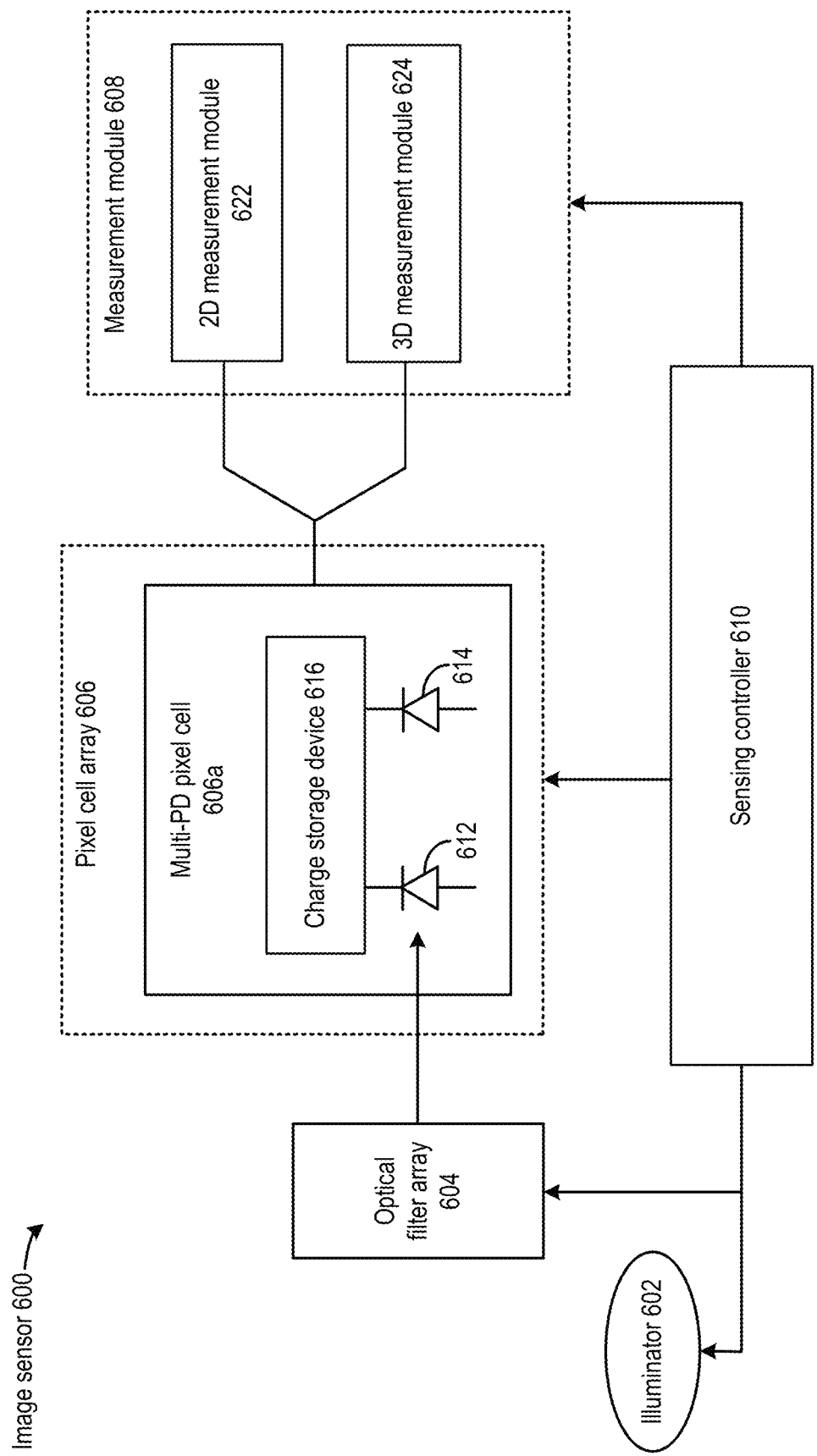
FIG. 6 illustrates an example of an image sensor including a multi-photodiode pixel cell.

FIG. 6 illustrates an example of an image sensor 600. Image sensor 600 can use the same pixel cell for both 2D sensing and 3D sensing. For example, the same pixel cell can be configured to detect a color component (e.g., red, green, or blue color) of visible light for 2D sensing, and to detect infra-red light for 3D sensing. Image sensor 600 can be part of near-eye display 100, and can provide 2D and 3D image data to control circuitries 510 of FIG. 5 to control the display content of near-eye display 100. In the example of FIG. 6, image sensor 600 may include an illuminator 602, an optical filter array 604, a pixel cell array 606, including a pixel cell 606a, and a digitizer module 608.

Illuminator 602 may be an infra-red illuminator, such as a laser, a light emitting diode (LED), etc., that can project infra-red light for 3D sensing. The projected light may include, for example, structured light, light pulses, etc. Optical filter array 604 may include an array of filter elements, with each filter element corresponding to a pixel cell of pixel cell array 606 (e.g., pixel cell 606a). Each filter element can be configured to absorb a certain wavelength range of incident light and transmit the rest of the light to the corresponding pixel cell. The incident light may include ambient visible light as well as infra-red light projected by illuminator 602 and reflected by an object. For example, one filter element may transmit a green component of visible light as well as the infra-red light to a pixel cell, whereas another filter element may transmit a blue component of visible light as well as the infra-red light to another pixel cell. In some examples, optical filter array 604 may be configurable to select the color component of visible light to be transmitted with the infra-red light, so that the pixel cell 606a can be used to detect different color components of visible light as well as infra-red light.

Moreover, pixel cell 606a may include multiple photodiodes to detect the different color components of visible light as well as infra-red light of the incident light. For example, as shown in FIG. 6, pixel cell 606a may include a photodiode 612 and a photodiode 614. Photodiode 612 and photodiode 614 can be pinned photodiodes. Photodiode 612 may detect a first component of the incident light of a first wavelength range (e.g., one of red, blue or green colors of visible light), convert the detected photons to charge, and store the charge, within an exposure period. Moreover, photodiode 614 may detect a second component of the incident light of a second wavelength range (e.g., infra-red light), convert the detected photons to charge, and store the charge, within the same or different exposure periods. Pixel cell 606a may further include a charge storage device 616, which can include a floating drain node, a metal capacitor, or a combination of both. At the end of the exposure periods, the charge stored at photodiodes 612 and 614 can be transferred to charge storage device 616 to develop voltages for 2D and 3D sensing.

Image sensor 600 further includes a measurement module 608. Measurement module 608 may further include a 2D measurement module 622 to perform 2D imaging operations based on the charge generated by photodiode 612. The 2D imaging operation may include, for example, generating a pixel value based on the magnitude of the voltage developed at charge storage device 616 which reflects the total quantity of charge stored at photodiode 612 during the exposure period. Measurement module 608 may include a 3D measurement module 624 to perform 3D imaging operations based on the charge generated by photodiode 614. The 3D imaging operations may include, for example, detecting a pattern of structured light reflected by a surface of an object, and comparing the detected pattern with the pattern of structured light projected by illuminator 602 to determine the depths of different points of the surface with respect to the pixel cells array. For detection of the pattern of reflected light, 3D measurement module 624 can generate a pixel value based on the magnitude of the voltage developed at charge storage device 616 which reflects the total quantity of charge stored at photodiode 614 during the exposure period. As another example, 3D measurement module 624 can generate a pixel value representing a time-of-flight measurement of light pulses transmitted by illuminator 602 and reflected by the object.

Figure 7A:
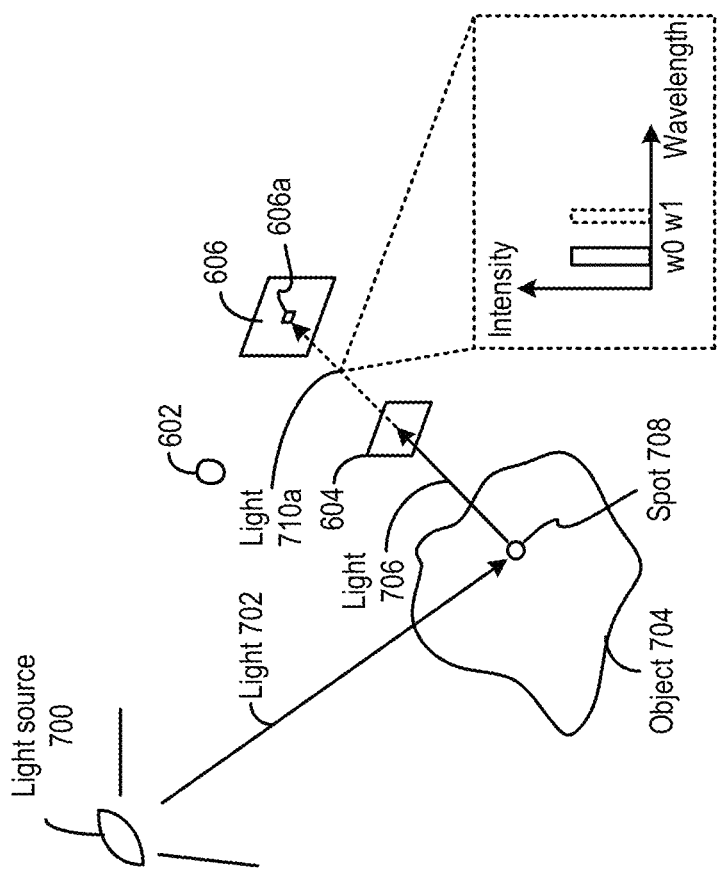
FIG. 7A and FIG. 7B illustrate examples of operations of the image sensor of FIG. 6.
Figure 7B:
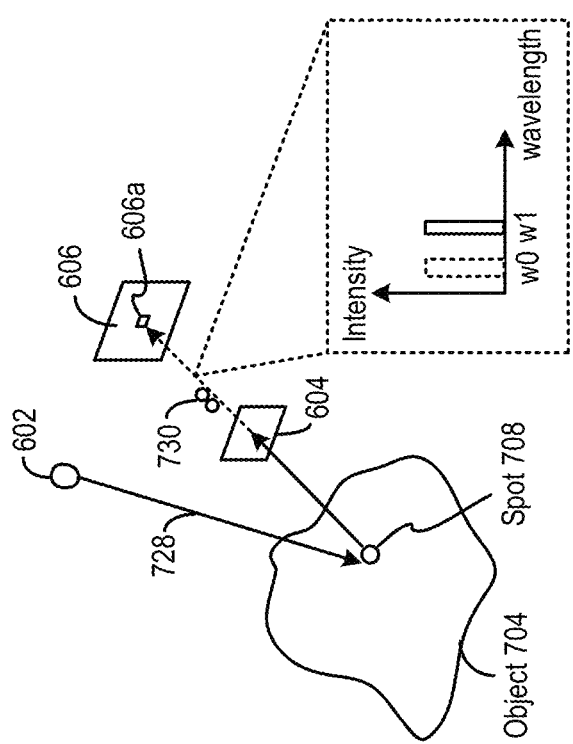

Image sensor 600 further includes a sensing controller 610 to control different components of image sensor 600 to perform 2D and 3D imaging of an object. Reference is now made to FIG. 7A and FIG. 7B, which illustrate examples of operations of image sensor 600 for 2D and 3D imaging. FIG. 7A illustrates an example of operations for 2D imaging. For 2D imaging, pixel cells array 606 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can be filtered by optical filter array 604 to pass a pre-determined wavelength range w0 of the reflected visible light 706, to produce filtered light 710a. Wavelength range w0 may correspond to a first color component of visible light 706 (e.g., a red color component having a wavelength range of 620-750 nanometers (nm))

reflected off spot 708. Filtered light 710a can be captured by first photodiode 612 of pixel cell 606a to generate and accumulate first charge within an exposure period. At the end of the exposure period, sensing controller 610 can steer the first charge to charge storage device 616 to generate the voltage representing the intensity of the first color component, and provide the first voltage to 2D measurement module 622. 2D measurement module 622 may include an analog-to-digital converter (ADC) and can be controlled by sensing controller 610 to sample and quantize the first voltage to generate a digital value representing the intensity of the first color component of visible light 706.

Furthermore, image sensor 600 can also perform 3D imaging of object 704. Referring to FIG. 7B, sensing controller 610 can control illuminator 602 to project infra-red light 728, which can include a light pulse, structured light, etc., onto object 704. Infra-red light 728 can have a wavelength range of 700 nanometers (nm) to 1 millimeter (mm). Infra-red photons 730 can reflect off object 704 and propagate towards pixel cells array 606 and pass through optical filter 604. In some examples, second photodiode 614 of pixel cell 606a can convert infra-red photons 730 into second charge. The detection and conversion of infra-red photons 730 by second photodiode 614 can occur within the same exposure period as the detection and conversion of visible light 706 by first photodiode 612. Such arrangements allow each pixel cell to perform 2D and 3D imaging of the same spot of an object, which can improve the correspondence between the 2D and 3D images. Sensing controller 610 can steer the second charge to charge storage device 616 to generate the a voltage representing the intensity of the infra-red light received at the pixel cell.

3D measurement module 624 can perform different types of depth-sensing operations based on the type of light 728 projected onto object 704. In a case where structured light 728 is projected onto object 704, 3D measurement module 624 may include an ADC and can be controlled by sensing controller 610 to sample and quantize the second voltage to generate a digital value representing the intensity of the infra-red light reflected by spot 708. A pattern of infra-red light intensities reflected by object 704 can be obtained from the digital values. The pattern can be compared with the structured light pattern projected by illuminator 602 to determine the depths of different spots on the surface of object 704, including spot 708, with respect to pixel cells array 606. In a case where infra-red light 728 includes light pulses, 3D measurement module 624 can detect a change of stored charge at second photodiode 614. A time-of-flight of an infra-red light pulse can be determined based on a time difference between when the light pulse exits illuminator 602 and when the change of stored charge at second photodiode 614 is detected. Based on the information provided by each pixel cell, a 3D image of object 704 can be generated.

Figure 8:
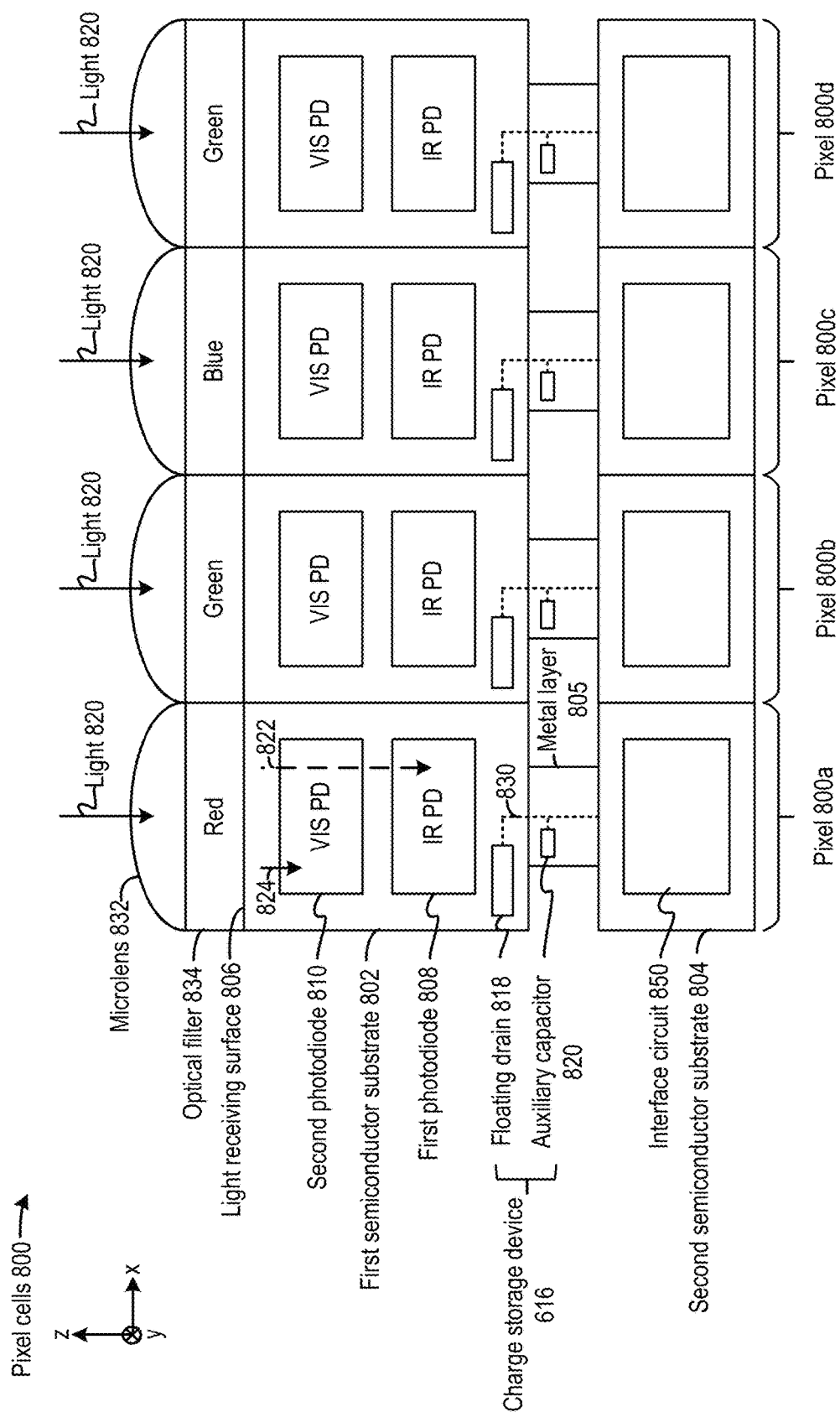
FIG. 8 illustrates an example of an array of pixel cells that can be part of the image sensor of FIG. 6.

FIG. 8 illustrates an example of an array of pixel cells 800 (e.g., pixel cells 800a, 800b, 800c, and 800d) which can perform collocated 2D and 3D image sensing and can be part of image sensor 600. As shown in FIG. 8, each of pixel cells 800 can include a first semiconductor substrate 802, a second semiconductor substrate 804, as well as a metal layer 805 sandwiched between the substrates. First semiconductor substrate 802 can include a light receiving surface 806, a first photodiode 808, a second photodiode 810, and charge storage device 616, whereas second semiconductor substrate 804 can include an interface circuit 850. First photodiode 808 and second photodiode 810 can form a stack along an axis perpendicular to light receiving surface 806 (e.g., along the z-axis). Second photodiode 810 can be configured as a visible light sensing photodiode ("VIS PD") whereas first photodiode 808 can be configured as an infra-red light sensing photodiode ("IR PD"). Specifically, second photodiode 810 can be closer to light receiving surface 806 than first photodiode 808. As light 820 enters via light receiving surface 806 and propagates within first semiconductor substrate 802, a first light component 822 of light 820 having the relatively longer infra-light wavelength range can propagate through second photodiode 810 to reach and can be absorbed by first photodiode 808. Moreover, a second light component 824 of light 820 having the relatively shorter visible light wavelength range stops at second photodiode 810 and can be absorbed by second photodiode 810.

Each of pixel cells 800 also includes optical components to control the properties of first light component 822 and second light component 824 of light 820. For example, each of pixel cells 800 includes a microlens 832 to focus light 820, as well as an optical filter 834 to select, for example, the wavelength range of second light component 824 (e.g., one of red, green, or blue colors) to be absorbed/measured by second photodiode 810. As shown in FIG. 8, each of pixel cells 800a, 800b, 800c, and 800d can receive infra-red light as first light component 822, but receive visible light of different wavelength ranges as second light component 824 based on the configuration of color filter 834. In the example of FIG. 8, pixel cell 800a may receive red light as second light component 824, pixel cells 800b and 800d may receive green light as second light component 824, whereas pixel cell 800c may receive blue light as second light component 824.

Each of first photodiode 808 and second photodiode 810 can generate charge responsive to, respectively, first light component 822 and second light component 824. The rate of charge generation by each photodiode can represent the intensities of first light component 822 and second light component 824. The charge generated by first photodiode 808 and second photodiode 810 can be stored in charge storage device 616 which, in the example of FIG. 8, can include a floating drain node 818 in first semiconductor substrate 802 and an auxiliary metallic capacitor 820 in metal layer 805. The quantity of charge accumulated in charge storage device 616, as well as the rate of charge accumulation in charge storage device 616, can be measured by interface circuit 850. Interface circuit 850 may include measurement module 608 of FIG. 6 to determine, for example, the intensities of first light component 822 and second light component 824. Metal layer 105 further includes metal interconnects 830 which can couple floating drain node 818 and auxiliary metallic capacitor 820 with measurement module 608 of second semiconductor substrate 804. Metal interconnects 830 can transmit voltages developed at charge storage device 616 corresponding to the charge generated by first photodiode 808 and second photodiode 810 to measurement module 608 to perform measurements for the 2D and 3D image sensing operations as described above.

Although FIG. 8 illustrates first photodiode 808 and second photodiode 810 of pixel cell 800 forms a stack structure which enables the two photodiodes to sense different light components, pixel cell 800 can adopt other configurations to separate the light components. For example, the two photodiodes can be arranged adjacent to each other along an axis parallel with light receiving surface 806 (e.g., along the x or y axes), and an optical structure can be provided on light receiving surface 806 to split the light components and project/direct different light components to the photodiodes.

Figure 9A:
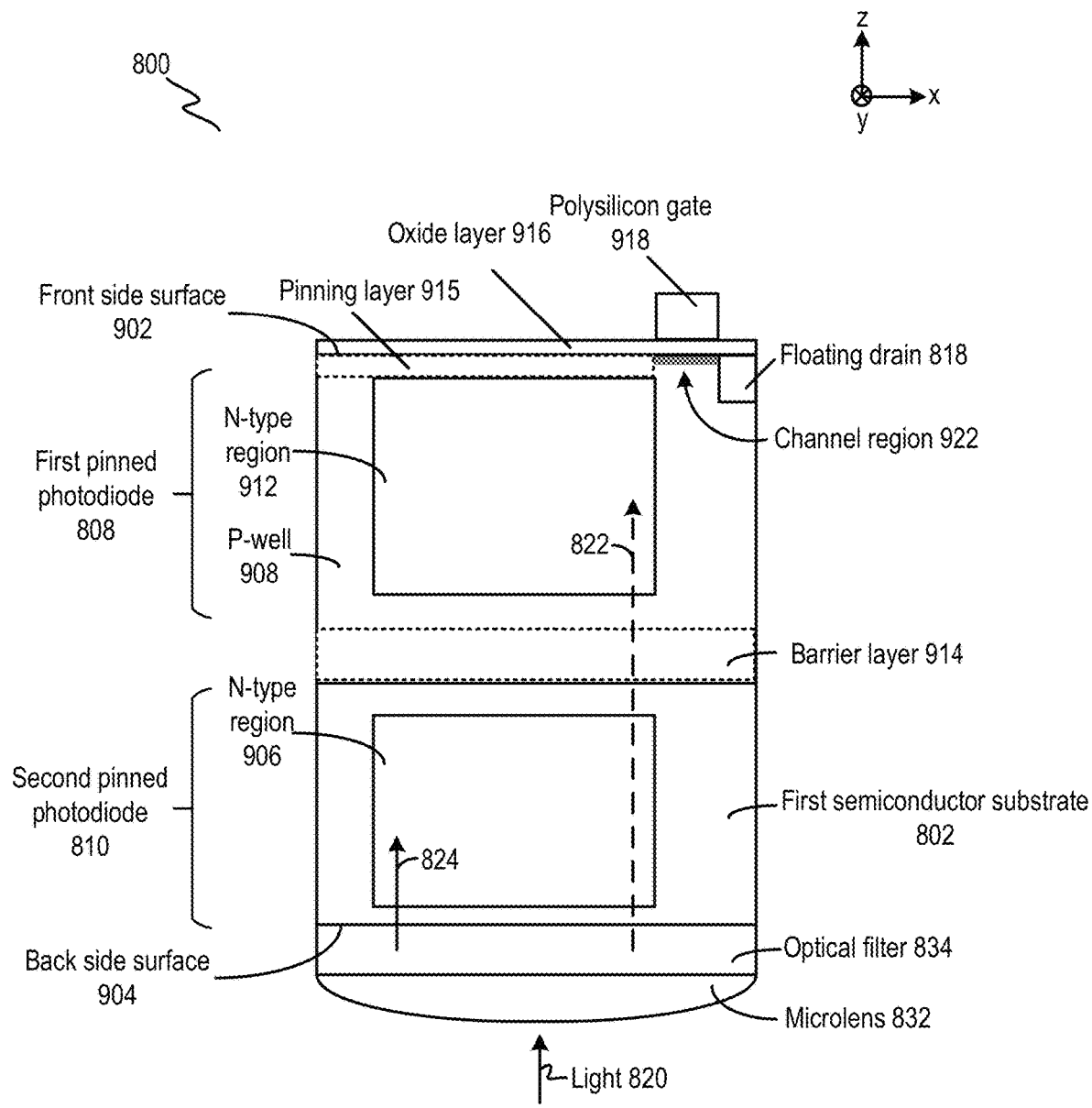
FIG. 9A and FIG. 9B illustrate examples of internal components of the array of pixel cells of FIG. 8.
Figure 9B:
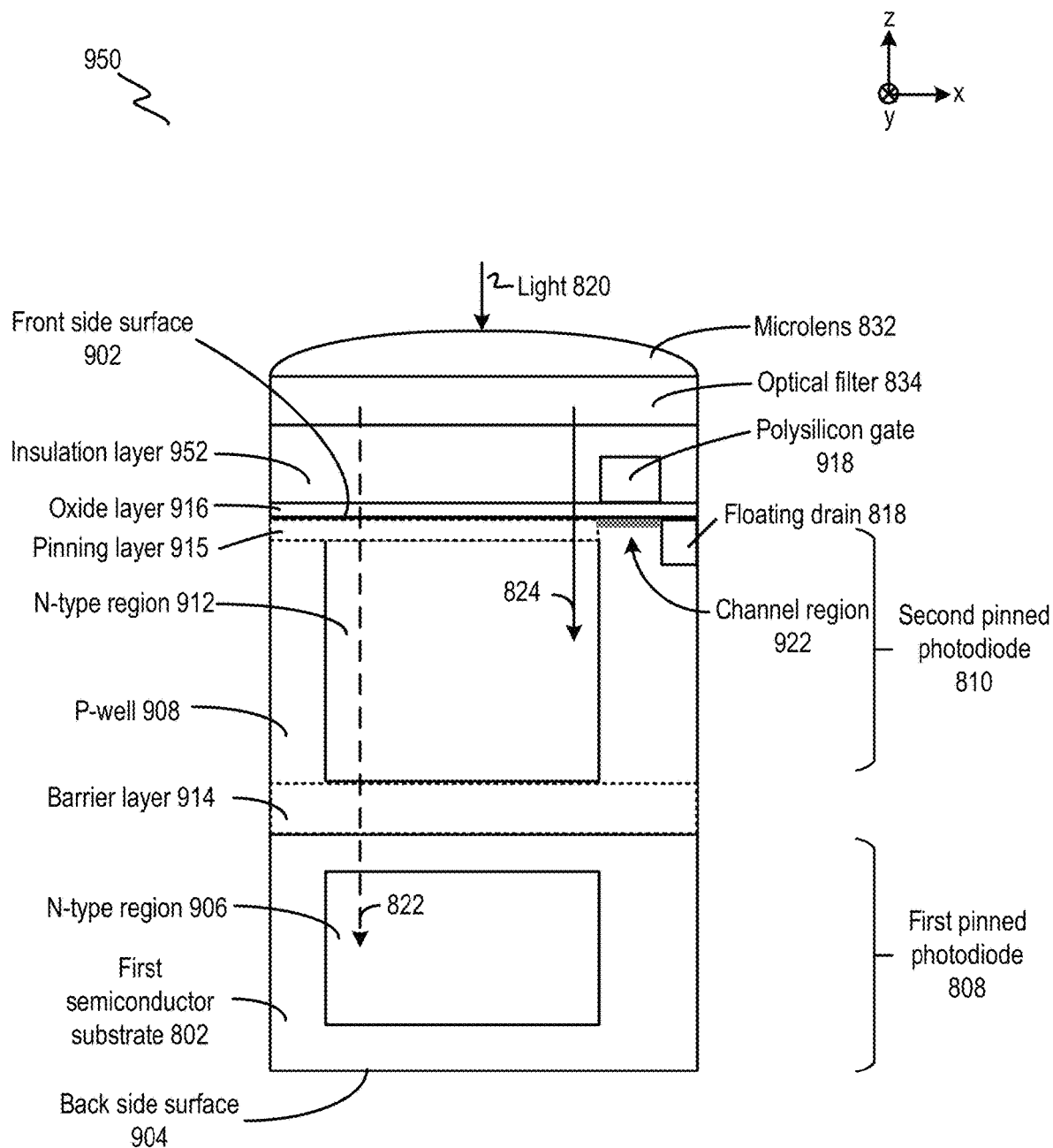

Reference is now made to FIG. 9A and FIG. 9B, which illustrate examples of other components of semiconductor substrate 802 not shown in FIG. 8. FIG. 9A and FIG. 9B illustrate pixel cell 800 formed in a P-type semiconductor substrate 802. In FIG. 9A and FIG. 9B, semiconductor substrate 802 can have a front side surface 902 and a back side surface 904. Front side surface 902 is where additional semiconductor processing, such as formation of polysilicon gate 918, doping and/or ion implantation to form first photodiode 808, second photodiode 810, floating drain node 818, a pinning layer 915, etc. In FIG. 9A, pixel cell 800 can be configured as a back side illuminated device, in which back side surface 904 is configured as light receiving surface 806, and microlens 832 and optical filter 834 can be placed on back side 904 surface to control the properties of first light component 822 and second light component 824 of light 820. In FIG. 9B, pixel cell 800 can be configured as a front side illuminated device, in which front side surface 902 is configured as light receiving surface 806. An insulation layer 952 can be put over polysilicon gate 918 and oxide layer 916 on front side surface 902, and microlens 832 and optical filter 834 can be placed on insulation layer 952 to control the properties of first light component 822 and second light component 824 of light 820.

In the examples of FIG. 9A and FIG. 9B, first photodiode 808 and second photodiode 810 can be configured as pinned photodiodes. In FIG. 9A, second pinned photodiode 810 can be formed by including an N-type region 906 embedded within P-type semiconductor substrate 802. Pixel cell 800 further includes a P-well 908 and an N-type region 912 embedded within P-well 908 to first pinned photodiode 808. In FIG. 9A, N-type region 912 is further away from back side surface 904 (configured as light receiving surface 806) than N-type region 906, which allows first pinned photodiode 808 to primarily detect an infra-red component (e.g., first light component 822) of light 820 and second pinned photodiode 810 to primarily detect a visible light component (e.g., second light component 824) of light 824. In FIG. 9B, the positions of first pinned photodiode 808 and second pinned photodiode 810 can be reversed, with first pinned photodiode 808 formed from N-type region 906 whereas second pinned photodiode 810 formed from N-type region 912. In FIG. 9B, N-type region 912 is closer to front side surface 902 (configured as light receiving surface 806) than N-type region 906, which allows first pinned photodiode 808 and second pinned photodiode 810 to detect components of different wavelengths as in FIG. 9A. First pinned photodiode 808 and second pinned photodiode 810 can have the same or different pinning voltages (e.g., maximum voltage difference across the photodiodes). In both first pinned photodiode 808 and second pinned photodiode 810, the complete isolation of N-type region 906 and N-type region 912 within P-type substrate 901 and P-well 908 can provide better dark-current and noise performance.

In both FIG. 9A and FIG. 9B, a barrier layer 914 is also formed between first pinned photodiode 808 and second pinned photodiode 810, and first pinned photodiode 808, barrier layer 914, and second pinned photodiode 810 can form a stack along a direction of propagation of light within P-type semiconductor substrate 802 (e.g., along the z-axis). As to be described in more detail below, barrier layer 914 can prevent a charge stored in first pinned photodiode 808 from entering second pinned photodiode 810. Barrier layer 914 can also regulate flow of charge from second pinned photodiode 810 to first pinned photodiode 808 for read out and quantization. In some examples, barrier layer 914 can be a P-type layer and be part of P-well 908 (or P-type semiconductor substrate 802), or can be part of a P+ region with a higher P-type doping concentration. In some examples, barrier layer 914 can also be an N-type layer (e.g., having a lower N-type doping concentration than both N-type region 906 and N-type region 912).

As described above, pixel cell 800 further includes pinning layer 915, oxide layer 916, polysilicon gate 918, and floating drain 818 on a front side surface 902. Pinning layer 915 can be configured to separate N-type region 912 from directly interfacing with oxide layer 916 to reduce dark current caused by surface-hole combination at the interface between oxide layer 916 and the substrate, which can further improve the dark current performance of the first pinned photodiode. In some examples, pinning layer 915 can form the second pinned photodiode with N-type region 912, and P-well 908 can be removed from device 900. Polysilicon gate 918 can receive a voltage and exert an electric field, via oxide layer 916, to create a channel at a channel region 922 between N-type region 912 and floating drain 818. The channel can be created to read out a charge generated by one of the first photodiode 808 or second photodiode 810.

Figure 10A:
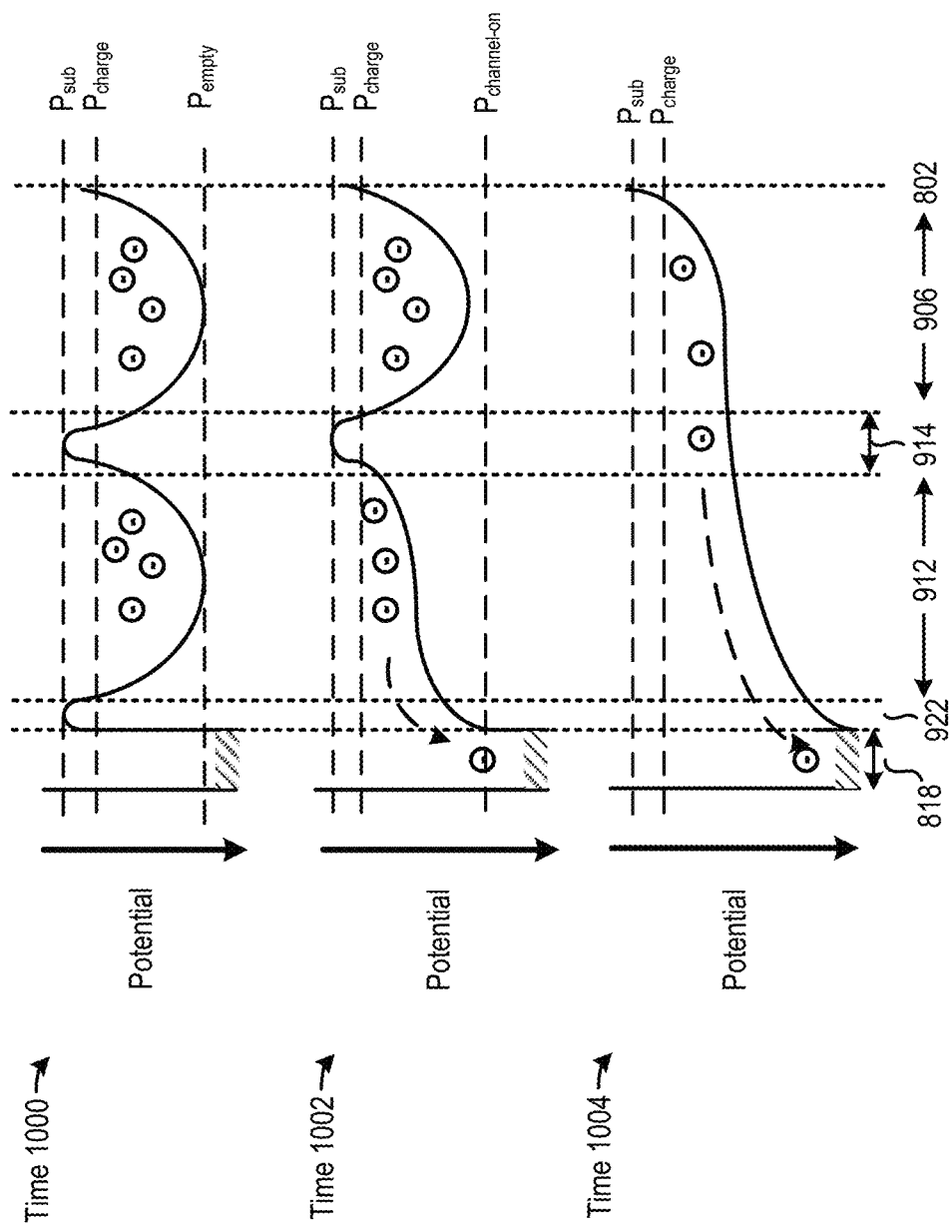
FIG. 10A and FIG. 10B illustrate examples of electrical potential distributions for read out of charges from the array of pixel cells of FIG. 8.
Figure 10B:
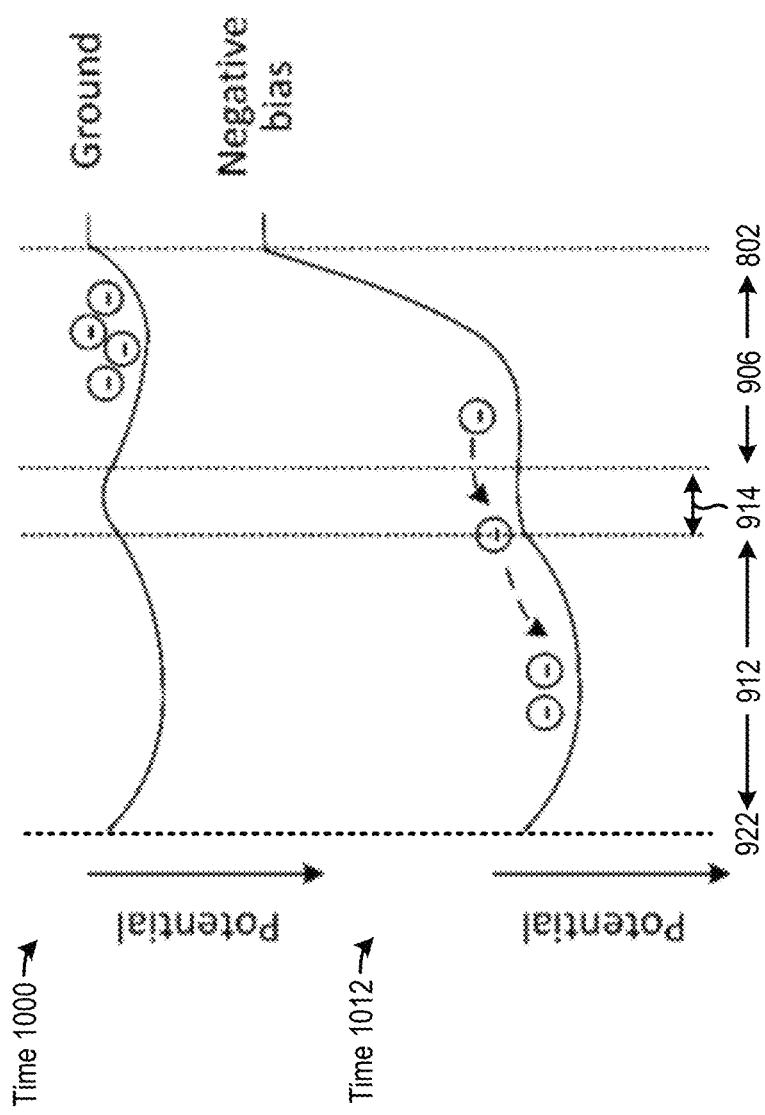

FIG. 10A and FIG. 10B illustrate examples of electrical potential distributions within first semiconductor substrate 802 for read out of charge from first or second photodiodes 808 and 810. FIG. 10A illustrates an example in which the electrical potential of barrier layer 914 is modulated with respect to time to perform the read out. Referring to FIG. 10A, at time 1000, N-type region 912 and N-type region 906 store negative charged generated in response to first and second light components 822 and 824, and each can have an electrical potential $P_{charge}$. The electrical potential $P_{charge}$ can be defined based on the quantity of charge, the capacities of the quantum wells of N-type region 912 and N-type region 906, and the electrical potential of the quantum wells when they are empty, $P_{empty}$. Meanwhile, channel region 922 can be in an off state and a channel is not yet created at channel region 922. The electrical potential at channel region 922 can be at an electrical potential lower than $P_{charge}$. Moreover, barrier layer 914 can be in an off-state and can be set at an electrical potential to prevent charge from flowing between N-type region 912 and N-type region 906, and the electrical potential at N-type region 912 can also be at an electrical potential lower than $P_{charge}$. In FIG. 10A, the electrical potentials at channel region 922 and barrier layer 914 can be similar to $P_{sub}$.

At time 1000, the storage capacities of both N-type region 912 and N-type region 906 can be at the maximum. The maximum quantity of charge that can be stored in N-type region 912 can be defined based on the quantum well capacity of N-type region 912, and the electric potentials of channel region 912 and barrier substrate 914 when both are in the off-state. With such arrangements, when the maximum quantity of charge is stored in N-type region 912, $P_{charge}$ can remain higher than the electrical potentials of both barrier substrate 914 and channel region 912 to trap the charge in N-type region 912. As to be described in details below, the electrical potential at channel region 922 can be configured to set the storage capacity of N-type region 912. Moreover, the maximum quantity of charge that can be stored in N-type region 906 can be defined based on the quantum well capacity of N-type region 906, the electrical potential $P_{sub}$ of first semiconductor substrate 802, and the electrical potential of barrier substrate 914 in the off-state, as well as $P_{empty}$, such that when the maximum quantity of charge is stored in N-type region 906, $P_{empty}$, remains higher than the potentials of both first semiconductor substrate 802 and barrier layer 914 to trap the charge in N-type region 906.

At time 1002, the charge stored in N-type region 912 can be read out. To read out the charge, the electrical potential in channel region 922 can be increased to $P_{channel-on}$ by applying a voltage at polysilicon gate 918 to form a channel at channel region 922. Negative charge stored in N-type region 912 can flow to channel region 922 and then floating drain 818. Meanwhile, the electrical potential of barrier 914 remains at $P_{sub}$ which is lower than the electrical potential $P_{charge}$ of charge stored at N-type region 906. As a result, the charge stored at N-type region 906 remains trapped at the region.

At time 1004, the electrical potential of barrier layer 914 can be increased to be equal to or higher than $P_{charge}$. The charge stored at N-type region 906 can flow to N-type region 912. In the example of FIG. 10A, the electrical potential in channel region 922 can be maintained at $P_{channel-on}$ and all of the charge from N-type region 906 can be transferred to floating drain 818. In some examples, as to be described below, the charge stored at N-type region 906 can be transferred to floating drain 818 in multiple steps for measurement operations for different light intensities.

FIG. 10B illustrates another example in which the electrical potential of barrier layer 914 is kept constant, but the electrical potential of first semiconductor substrate 802 is modulated to perform the read out of charge at N-type region 906. As shown in FIG. 10B, a negative electrical potential can be applied to first semiconductor substrate 802 at time 1012, which causes the electrical potential of barrier layer 914 to become higher than that of first semiconductor substrate 802. Negative charge stored at N-type region 906 can then flow across barrier layer 914 and then channel region 922 and floating drain 818, all of which can have higher potentials than N-type region 906 when the negative electrical potential is applied to first semiconductor substrate 802.

Figure 11A:
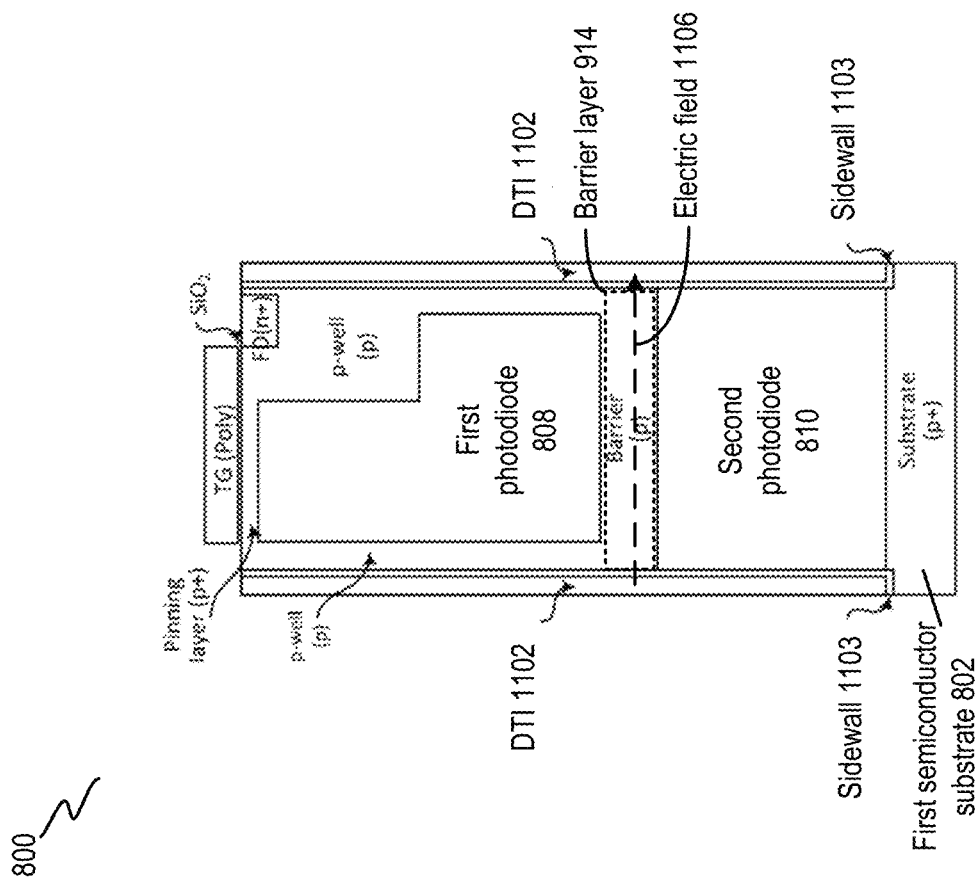
FIG. 11A and FIG. 11B illustrate example structures for modulation of electrical potentials for read out of charges in the array of pixel cells of FIG. 8.
Figure 11B:
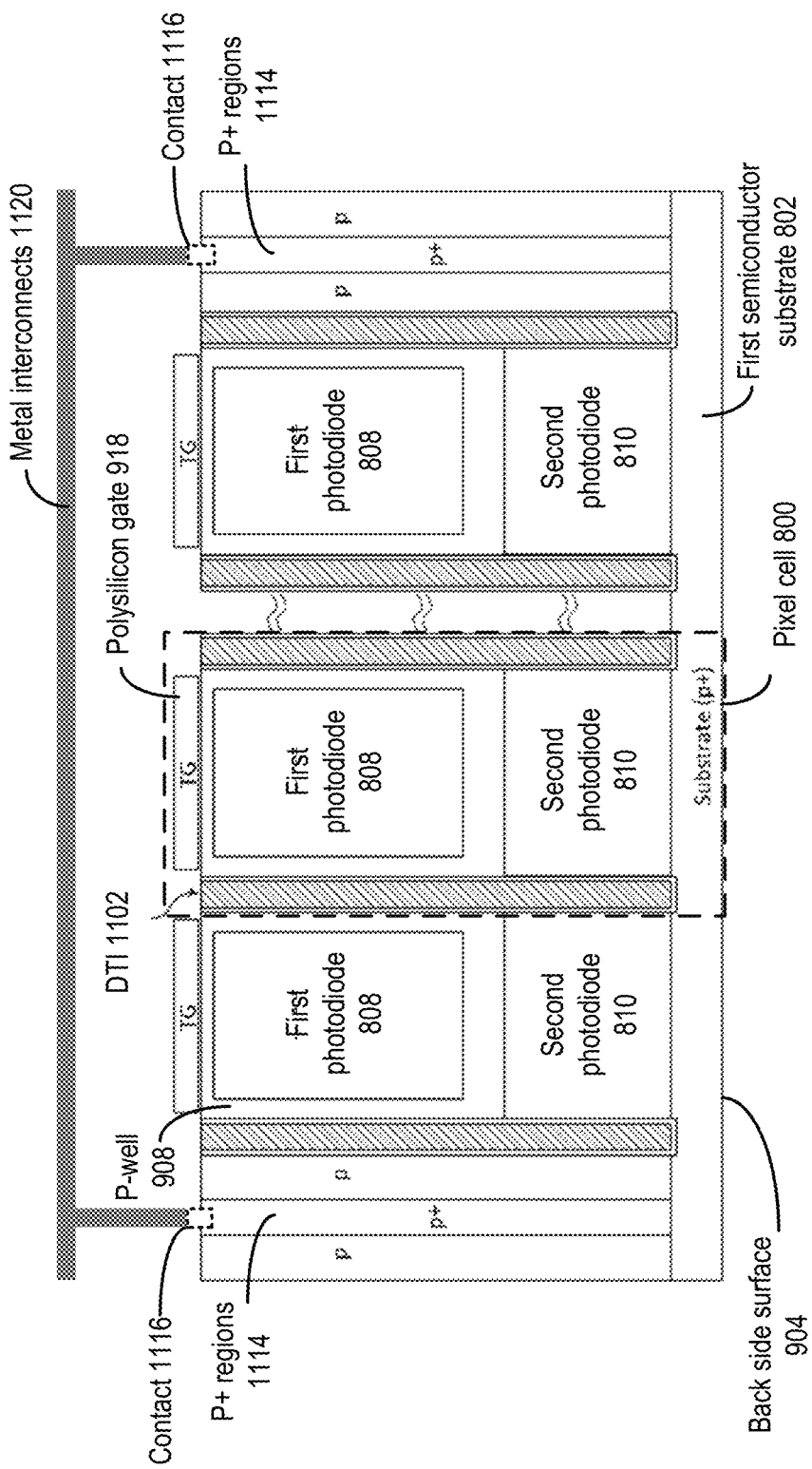

FIG. 11A and FIG. 11B illustrate example structures of pixel cell 800 for modulation of electrical potentials of barrier layer 914 and first semiconductor substrate 802. As shown in FIG. 11A, pixel cell 800 may include one or more deep trench isolation (DTI) structures 1102. The DTI structures can act as insulators to reduce coupling between adjacent pixel cell devices (e.g., pixel cells that are placed adjacent to each other along the x and y axes), and to further improve the isolation of the N-type region within the substrate. Each DTI structure may include one or more sidewalls 1103 made of silicon oxide and filled with a filling material. The filling material may include a metal or doped polysilicon and can be conductive. The filling material can receive a voltage signal to generate an electric field.

DTI structures 1102 can be used to control barrier layer 914. For example, DTI structures 1102 may receive a voltage signal to generate an electric field including an electric field 1106 across barrier layer 914. The electric field can change the distribution of charge carriers within barrier layer 914 and can change its electrical potential with respect to first semiconductor substrate 802, as shown above in FIG. 10A.

In some cases, it may be desirable to maintain the electrical potential of DTI structures 1102 at a constant. For example, to further suppress dark current, DTI structures 1102 can be actively quenched by applying negative bias to accumulate holes near the Si—$SO_2$ interface. In such cases, the electrical potential of first semiconductor substrate 802 can be modulated, as shown above in FIG. 10B, to control the read out of charge from N-type region 906. FIG. 11B illustrates example structures of pixel cell 800 to support modulation of electrical potential of first semiconductor substrate 802. As shown in FIG. 11B, one or more P+ regions 1114 can be formed that extend from the front side and run parallel with the DTI structures 1102 to reach substrate 802 on the back side (towards back side surface 904). The P+ regions 1114 further include contacts 1116. Metal interconnects 1120 can be provided on front side surface 902 to access P+ regions 1114 via contacts 1116, and a negative bias can be applied at metal interconnects 1120 to modulate the electrical potential of first semiconductor substrate 802 as shown in FIG. 10B.

Figure 12:
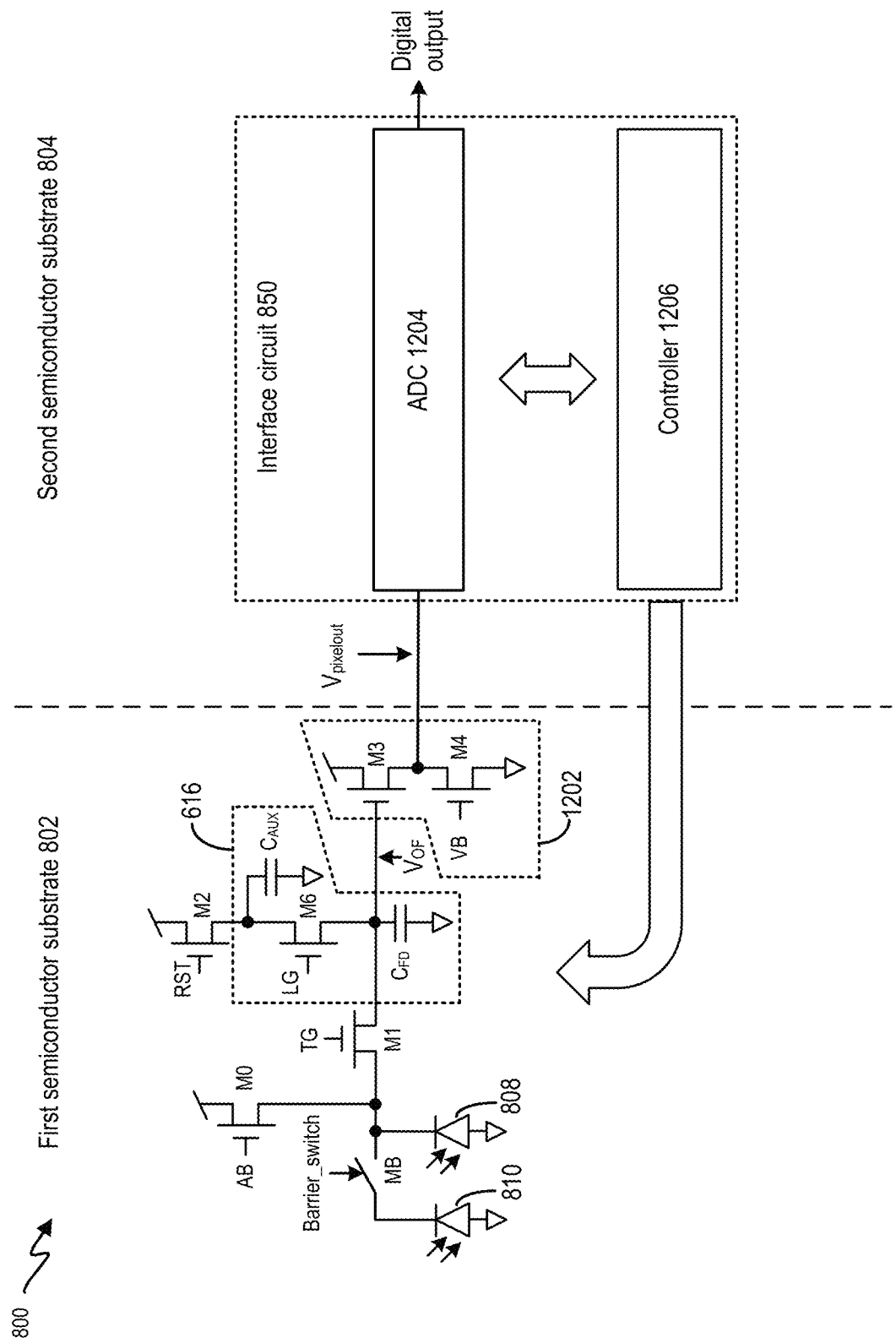
FIG. 12 illustrates an example schematic representation of a pixel cell of FIG. 8.

FIG. 12 illustrates an example schematic representation of various circuits of pixel cell 800. As shown in FIG. 12, pixel cell 800 includes a set of switches M0, M1, M2, M6, MB, first photodiode 808, second photodiode 810, charge storage device 616, a voltage buffer 1202, an analog-to-digital converter (ADC) 1204, and a controller 1206. First photodiode 808, second photodiode 810, charge storage device 616, as well as voltage buffer 1202 can be implemented in first semiconductor substrate 802, whereas ADC 1204 and controller 1206 can be implemented in second semiconductor substrate 804. First photodiode 808 and second photodiode 810 can be configured to primarily convert different components of incident light 820 to charge. The charge can be read out and stored in charge storage device 616 to develop a voltage (labelled "$V_{OF}$"), which can be buffered by voltage buffer 1202 to become a pixel output voltage (labelled "$V_{pixelout}$"). The pixel output voltage can be quantized by ADC 1204 to generate a digital output. Controller 1206 can control the switches as well as ADC 1204 to perform the read out and quantization processes.

First photodiode 808 and second photodiode 810 can be configured to primarily convert different components of incident light 820 to charge based on a configuration of pixel cell 800. For example, in a case where pixel cell 800 is a back-side illuminated (FSI) device where second photodiode 810 is closer to light receiving surface 806 than first photodiode 808, first photodiode 808 can be configured to detect infra-red light as first light component 822, whereas second photodiode 810 can be configured to detect visible light (e.g., one of red, green, or blue colors) as second light component 824. In a case where pixel cell 800 is a front-side illuminated (BSI) device where first photodiode 808 is closer to light receiving surface 806 than second photodiode 810, first photodiode 808 can be configured to detect visible light (e.g., one of red, green, or blue colors) as first light component 822, whereas second photodiode 810 can be configured to detect visible light (e.g., one of red, green, or blue colors) as second light component 824. Each of first photodiode 808 and second photodiode 810 has a quantum well to store charge generated in response to, respectively, first light component 822 and second light component 824.

In addition, charge storage device 616 can provide storage for read out of charge stored in first photodiode 808 and second photodiode 810. Before a new measurement, charge storage device 616 can be reset by the M2 reset switch, which can be enabled by the RST signal to connect charge storage device 616 to a charge sink to remove the charge stored in charge storage device 616. The charge can then be read out from first photodiode 808 or second photodiode 810 via transfer switch M1 and stored in charge storage device 616 for a subsequent quantization processing. Charge storage device 616 includes floating drain 818 (represented by "$C_{FD}$" in FIG. 12A) and auxiliary capacitor 820 (represented by "$C_{AUX}$" in FIG. 12) which can be combined to provide a variable combined capacitance. Specifically, floating drain 818 and auxiliary capacitor 820 are coupled with switch M6, which can be transistor controlled by the signal LG. When switch M6 is enabled, charge storage device 616 can have the combined capacitances of floating drain 818 and auxiliary capacitor 820 to store charge. When switch M6 is disabled, charge storage device 616 only includes the capacitance of floating drain 818 to store charge. As to be explained below, the capacitance of charge storage device 616 can be adjusted for different quantization operations. Charge storage device 616 can develop the $V_{OF}$ voltage based on the quantity of stored charge, which can be buffered by voltage buffer 1202 to become the pixel output voltage $V_{pixelout}$. The pixel output voltage $V_{pixelout}$ can be quantized by ADC 1204 to generate a digital output.

The switches M0, M1, and MB can control the generation and transfer of charge from first photodiode 808 and second photodiode 810 to charge storage device 616 for read out and quantization operations. Barrier switch MB can control the flow of charge from second photodiode 810 to first photodiode 808 for read out. Barrier switch MB can represent barrier layer 914 and can be controlled by the barrier_switch signal. The barrier_switch signal can represent an electrical potential difference between barrier layer 914 and first semiconductor substrate 802 and can be configured based on, for example, applying a positive electrical potential to barrier layer 914 (e.g., as described in FIG. 10A) via a DTI structure, applying a negative bias voltage to first semiconductor substrate 802 (e.g., as described in FIG. 10B), or a combination of both.

In addition, switch M0 can be a shutter switch. Shutter switch M0, controlled by the AB signal, can control the start and end of an exposure period in which first photodiode 808 is allowed to accumulate the charge generated in response to incident light 820. The disabling of shutter switch M0 can start the exposure period for both first photodiode 808 and second photodiode 810, whereas the enabling of shutter switch M0 can reset first photodiode 808 and end the exposure period for first photodiode 808. Meanwhile, second photodiode 810 can continue accumulating charge even after shutter switch M0 is enabled. The exposure period for second photodiode 810 can end when barrier switch MB is enabled and/or when transfer switch M1 is enabled to transfer the charge from second photodiode 810 to charge storage device 616. Shutter switch M0 can also be configured to provide an anti-blooming function to prevent charge generated by first photodiode 808 (and/or second photodiode 810) from leaking into other pixel cells of the image sensor, especially when the image sensor operates in an environment with strong ambient light.

Further, transfer switch M1 can be controlled by the TG signal to set the electrical potential of channel region 922, which can control the flow of charge to charge storage device 616. For example, the TG signal to configure transfer switch M1 in a partially-on state to allow charge accumulated at first photodiode 808 as residual charge until the quantity of stored charge at first photodiode 808 exceeds a threshold. Transfer switch M1 allows additional charge generated by first photodiode 808 to flow to charge storage device 616 as overflow charge. Moreover, TG signal can also configure transfer switch M1 in a fully-on state to transfer residual charge stored in first photodiode 808 to charge storage device 616 for read out and quantization.

Transfer switch M1 and barrier switch MB can control the read out and quantization of charge from first photodiode 808 and second photodiode 810. In a first read out, barrier switch MB can be disabled. Transfer switch M1 can be configured in the fully-on state to transfer charge from first photodiode 808 ("first charge") to charge storage device 616. The transferred first charge can be stored in charge storage device 616 and quantized by ADC 1204 to generate a first digital output. Both first photodiode 808 and charge storage device 616 can then be reset after the quantization completes. A second read out can follow, in which barrier switch MB can be enabled. Charge stored in photodiode 810 ("second charge") can then be transferred to photodiode 808 via barrier switch MB. Transfer switch M1 can also be configured in the fully-on state to transfer the second charge from photodiode 808 to charge storage device 616 for subsequent quantization by ADC 1204 to generate a second digital output.

Pixel cell 800 can be configured to perform a multi-stage read out and quantization processing of the first charge and the second charge. Each stage of read out and quantization processing can be associated with a particular intensity range of first light component 822 or second light component 824 to be sensed by, respectively, first photodiode 808 or second photodiode 810. Each intensity range can be defined by a maximum quantity of first charge or second charge to be generated by the respective photodiode, the storage capacities of the respective photodiode, and the storage capacity of charge storage device 616.

Figure 13A:
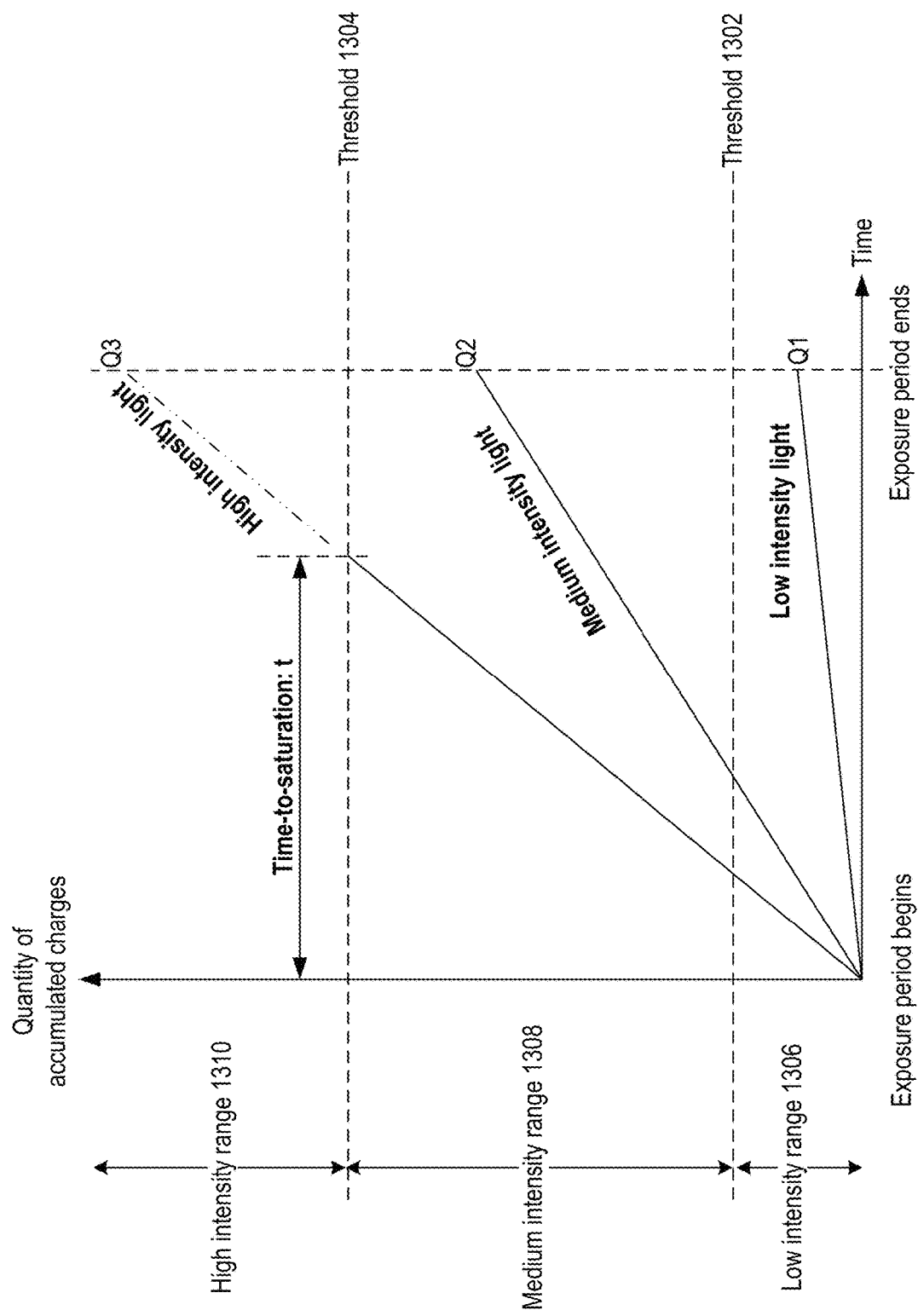
FIG. 13A, FIG. 13B, and FIG. 13C illustrate the operations of the pixel cell of FIG. 8 for different intensity ranges.

Reference is now made to FIG. 13A, which illustrates an accumulative quantity of first charge generated by first photodiode 808 with respect to time for different light intensity ranges. The accumulative quantity of first charge reflect the intensity of first light component 822 received by first photodiode 808 during an exposure period. The exposure period can be started by disabling the shutter switch M0 of FIG. 12 and ended by enabling the shutter switch M0. A threshold 1302 and a threshold 1304 can define a low intensity range 1306, a medium intensity range 1208, and a high intensity range 1310 for the intensity of first light component 822. For example, if the accumulative total of first charge is below threshold 1302 (e.g., Q1), the intensity of first light component 822 can be within low intensity range 1306. If the total accumulated first charge is between threshold 1304 and threshold 1302 (e.g., Q2), the intensity of first light component 822 can be within medium light intensity range 1308. If the total accumulated first charge is above threshold 1304, the intensity of first light component 822 can be within high intensity range 1310.

The definitions of low intensity range 1304, medium intensity range 1308, and high intensity range 1310, as well as thresholds 1302 and 1304, can be based on the charge storage capacities of first photodiode 808 and charge storage device 616. For example, low light intensity range 1306 can be defined such that the total quantity of first charge generated by first photodiode 808 within the exposure period is below or equal to the storage capacity of first photodiode 808. Such a quantity can be represented by threshold 1302. Referring back to FIG. 10A, threshold 1302, which represents the maximum quantity of charge stored in N-type region 912 of first photodiode 808, can be defined based on the quantum well capacity of N-type region 912, the bias voltage TG of the transfer switch M1 at the partially-on state which can set the electrical potential threshold of channel region 922 for overflow charge to flow, and an electrical potential of barrier substrate 914 at the off-state. If the intensity of first light component 822 is within low intensity range 1306, all of the first charge generated by first photodiode 808 within the exposure period can be stored in the quantum well of first photodiode 808 as first residual charge. As first photodiode 808 is not yet at capacity, the quantity of first residual charge stored at first photodiode 808 can correlate with the intensity of first light component 822, and the intensity of first light component 822 can be measured by measuring the quantity of the first residual charge.

If the intensity of first light component 822 exceeds low intensity range 1306 and is in the medium intensity range 1208 or in the high intensity range 1310, the accumulative total of first charge exceeds threshold 1302. Some of the first charge cannot be stored at first photodiode 808 as it is at capacity, and can flow to charge storage device 616 as first overflow charge. Medium intensity range 1208 can be defined such that the total quantity of first overflow charge stored at charge storage device 616 is within the storage capacity of charge storage device 616. In such a case, the quantity of first overflow charge stored at charge storage device 616 can correlate with the intensity of first light component 822, and the intensity of first light component 822 can be measured by measuring the quantity of the first overflow charge.

If the incident light intensity is within high intensity range 1310, the total overflow charge accumulated at charge storage device 616 may exceed threshold 1304 before the exposure period ends. As additional charge is accumulated, charge storage device 616 may reach full capacity before the end of the exposure period, and charge leakage may occur thereafter. As a result, the quantity of first overflow charge stored at charge storage device 616 may not correlate with the intensity of first light component 822. To avoid measurement error caused due to charge storage device 616 reaching full capacity, a time-to-saturation measurement can be performed to measure the time duration it takes for the first overflow charge accumulated at charge storage device 616 to reach threshold 1304. A rate of charge accumulation at charge storage device 616 can be determined based on a ratio between threshold 1304 and the time-to-saturation, and a hypothetical quantity of charge (Q3) that could have been accumulated at charge storage device 616 at the end of the exposure period (if the capacitor had limitless capacity) can be determined by extrapolation according to the rate of charge accumulation. The hypothetical quantity of charge (Q3) can provide a reasonably accurate representation of the incident light intensity within high intensity range 1310.

As described above, pixel cell 800 can perform a multi-stage read out and quantization of first charge, with each stage corresponding one of low intensity range 1306, medium intensity range 1308, or high intensity range 1310. Pixel cell 800 can have different configurations for different read out and quantization stages. For example, to perform the read out of first overflow charge for first light component 822 in the medium and high intensity ranges, the capacitance of charge storage device 616 can be expanded (e.g., by enabling control switch M6) to store more first overflow charge from first photodiode 808 until charge storage device 616 saturates, which can increase threshold 1304 of FIG. 13A, the upper limit of the medium intensity range. Moreover, to perform the read out of first residual charge stored in first photodiode 808, transfer switch M1 can be set in the fully-on state to transfer the first residual charge to charge storage device 616. Moreover, the capacitance of charge storage device 616 can be reduced (e.g., by disabling control switch M6) to increase the charge-to-voltage conversion rate, which can improve the sensitivity of the quantization process and reduce the effect of quantization noise, and the lower limit of measurable light intensity can be further reduced.

Figure 13C:
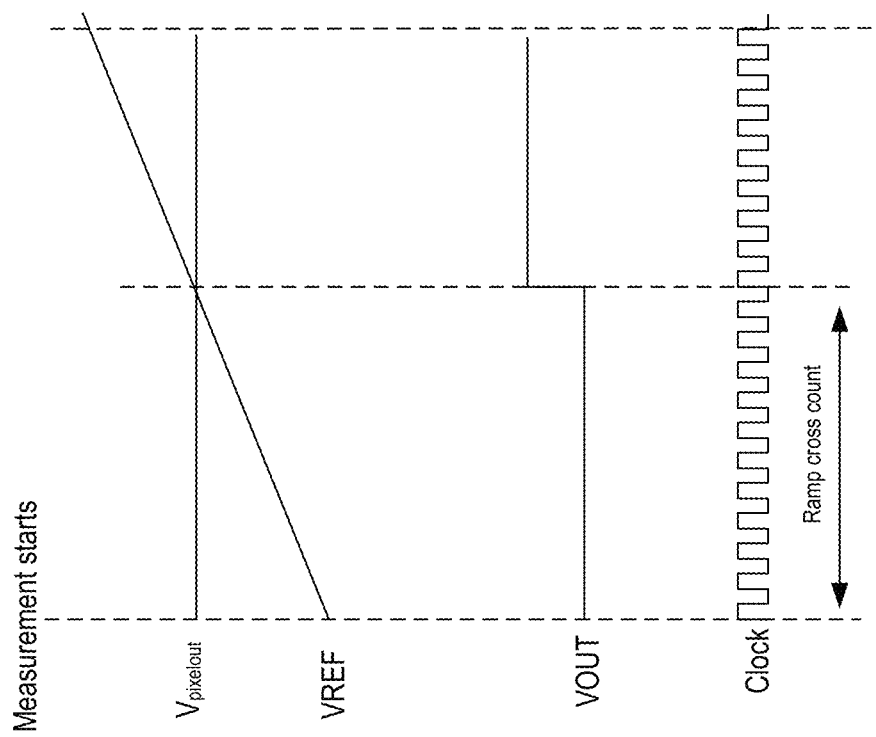
Figure 13B:
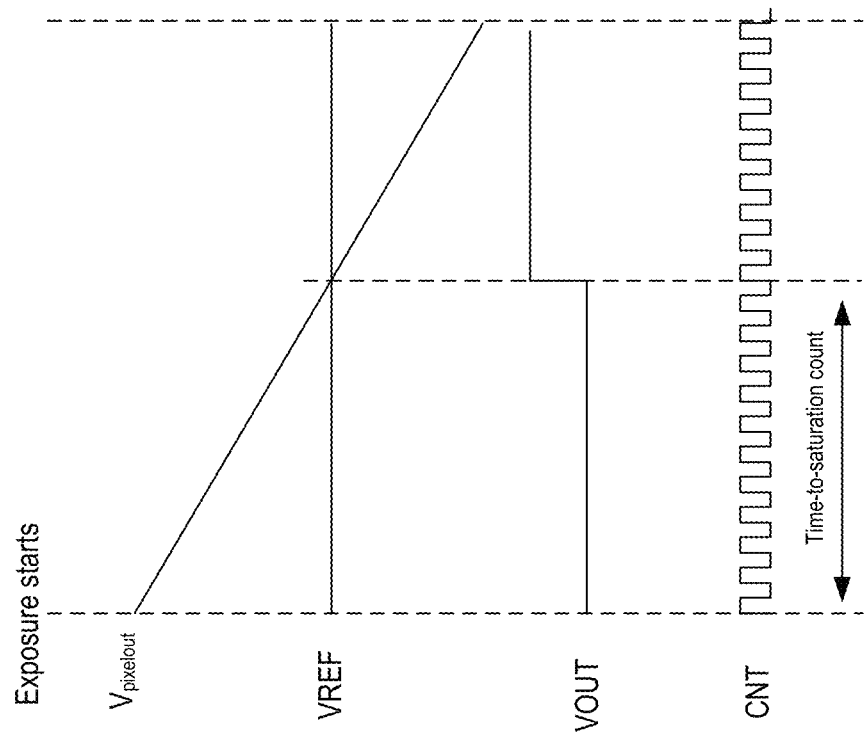

In addition, ADC 1204 can perform different quantization processes of the first charge for different intensity ranges. FIG. 13B and FIG. 13C illustrate examples of the different quantization processes. Referring to FIG. 13B, for quantization of the first charge in the high intensity range, ADC 1204 can perform a time-to-saturation measurement. ADC can compare $V_{pixelout}$ (the buffered voltage of charge storage device 616) with a static threshold voltage corresponding to, for example, threshold 1304 of FIG. 13A, which can correspond to a case where charge storage device 616 saturates. Based on a time when VOUT trips which indicates that charge storage device 616 saturates, ADC 1204 can obtain a time-to-saturation measurement. The time-to-saturation measurement can be based on, for example, the count value of a counter which starts counting when the exposure period starts and stops counting when the saturation of charge storage device 616 is detected. Moreover, referring to FIG. 13C, for quantization of the first charge in the low and medium intensity ranges, ADC 1204 can compare $V_{pixelout}$ with a ramping threshold voltage to find the threshold voltage that is the closest to $V_{pixelout}$. In some examples, the ramping threshold voltage can be generated by a digital-to-analog converter (DAC) based on counter values from a free running counter, with each threshold voltage level within the threshold voltage ramp being associated with a count value. The count value of the closest threshold voltage can be output as a digital output to represent the intensity of first light component 822.

Figure 14:
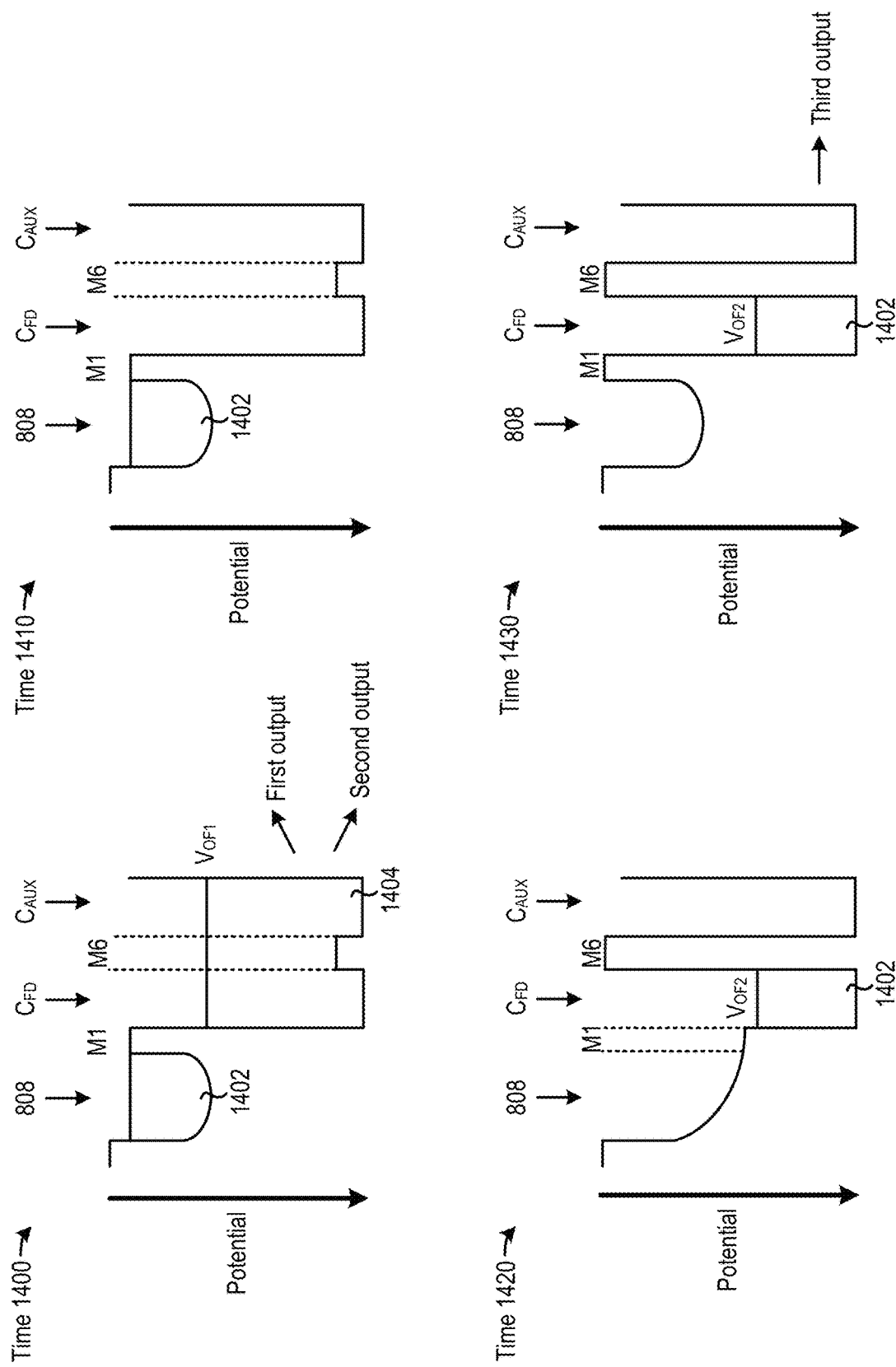
FIG. 14 illustrates an example sequence of read out and quantization of charge from the pixel cell of FIG. 8.

FIG. 14 illustrates an example sequence of read out and quantization of first charge, as well as the corresponding distributions of electrical potentials among first photodiode 808, transfer switch M1, capacitors $C_{FD}$ and $C_{AUX}$, as well as control switch M6. At time 1400, transfer switch M1 can be controlled by TG to be in a partially-on state to enable the quantum well of first capacitor 808 to hold first residual charge 1402. Moreover, the M6 control switch is enabled to increase the capacitance of charge storage device 616, such that charge storage device 616 includes a parallel combination of the $C_{FD}$ and $C_{AUX}$ capacitors. The expanded charge storage device 616 can store first overflow charge 1404 to output a $V_{OF1}$ voltage. ADC 1204 can compare the buffered $V_{OF1}$ voltage with threshold 1304 to determine whether first overflow charge 1404 saturates charge storage device 616. If first overflow charge 1404 saturates charge storage device 616, ADC 1204 can perform the time-to-saturation (TTS) operation to determine the time when the saturation occurs, and generate a first output representing the time-to-saturation measurement. If first overflow charge 1404 does not saturate charge storage device 616, ADC 1204 can measure the quantity of first overflow charge 1404 in charge storage device 616 by comparing the buffered $V_{OF1}$ voltage with a ramping threshold that spans between threshold 1302 and threshold 1304 to find a threshold that is the closest to $V_{OF1}$, and generate a second output representing the closest threshold. The ramping threshold can be generated by, for example, providing count values from a counter to a DAC, and the second output can be the count value that generates (via the DAC) the closest threshold. In some examples, the measurement of the first overflow charge 1404 in charge storage device 616 can be called a "FD ADC" operation.

At time 1410, following the TTS and FD ADC operations at time 1400, charge storage device 616 is can be reset to remove overflow charge 1404.

At time 1420, residual charge 1402 is transferred to charge storage device 616. Prior to the transfer, the capacitance of charge storage device 616 can be shrunk by disabling control switch M6 such that charge storage device 616 only includes the $C_{FD}$ capacitor, to increase the charge-to-voltage rate and to reduce the effect of quantization noise, as described above. Transfer switch M1 can then be controlled by the TG signal to be in a fully-on state to transfer first residual charge 1402 to the $C_{FD}$ capacitor, which can output a $V_{OF2}$ voltage. As the residual charge is accumulated at first photodiode 808 which is subject to less dark current, the effect of dark current on the measurement of the low intensity range can be reduced. All these can improve the accuracy of measurement of the low intensity range.

At time 1430, after the transfer of first residual charge 1402 completes, transfer switch M1 can be controlled by the TG signal to be in a fully-off state to isolate first residual charge 1402 within the $C_{FD}$ capacitor. ADC 1204 can measure the first residual charge 1402 in the $C_{FD}$ capacitor by comparing the buffered $V_{OF2}$ voltage with another ramping threshold to generate a third output. In some examples, the measurement of the first residual charge 1402 can be called a "PD ADC" operation. ADC 1204 can output one of the first output, second output, or third output based on the intensity range of first light component 822.

After read out and quantization of first charge, pixel cell 800 can also perform a multi-stage read out and quantization of the second charge. The second charge can be transferred to first photodiode 808 after the exposure period ends. As first photodiode 808 and second photodiode 810 receive different components of light within the same exposure period, while first photodiode 808 can output the first overflow charge to charge storage device 616 if the first charge saturates first photodiode 808 during the exposure period, second photodiode 810 is isolated from charge storage device 616 (and first photodiode 808) by barrier switch MB within the exposure period. Therefore, the storage capacity of second photodiode 810 needs to be large enough to store all of the second charge generated by second photodiode 810 within the same exposure period. Thus, the storage capacity of second photodiode 810 can be configured, based on setting the size of quantum well, the electrical potentials of first semiconductor substrate 802 and barrier layer 914, to become much larger than that of first photodiode 808. For example, the storage capacity of second photodiode 810 can be configured based on the length of exposure period, as well as the maximum intensity of second light component 824 to be measured by the image sensor, such that the storage capacity matches or exceeds the maximum quantity of second charge generated by second photodiode 810 within the exposure period.

Moreover, with the storage capacity of first photodiode 808 being smaller than second photodiode 810, charge transferred from second photodiode 810 to first photodiode 808 can be entirely stored in first photodiode 808 as second residual charge or can overflow to charge storage device 616 as second overflow charge. No TTS measurement is performed on the second charge as the second charge is transferred from second photodiode 810 to first photodiode 808 after the exposure period ends, and the rate of transfer of the second charge does not reflect the intensity of second light component 824. However, ADC 1204 can then perform the same sequences of FD ADC and PD ADC operations to measure, respectively, the second overflow charge and the second residual charge to generate two outputs, use the same threshold 1302 to identify the intensity range of second light component 824, and to provide one of the two outputs based on the identified intensity range. As ADC 1204 can perform the same quantization operations for the first charge and the second charge, the control of ADC 1204 can become more simplified.

Figure 15A:
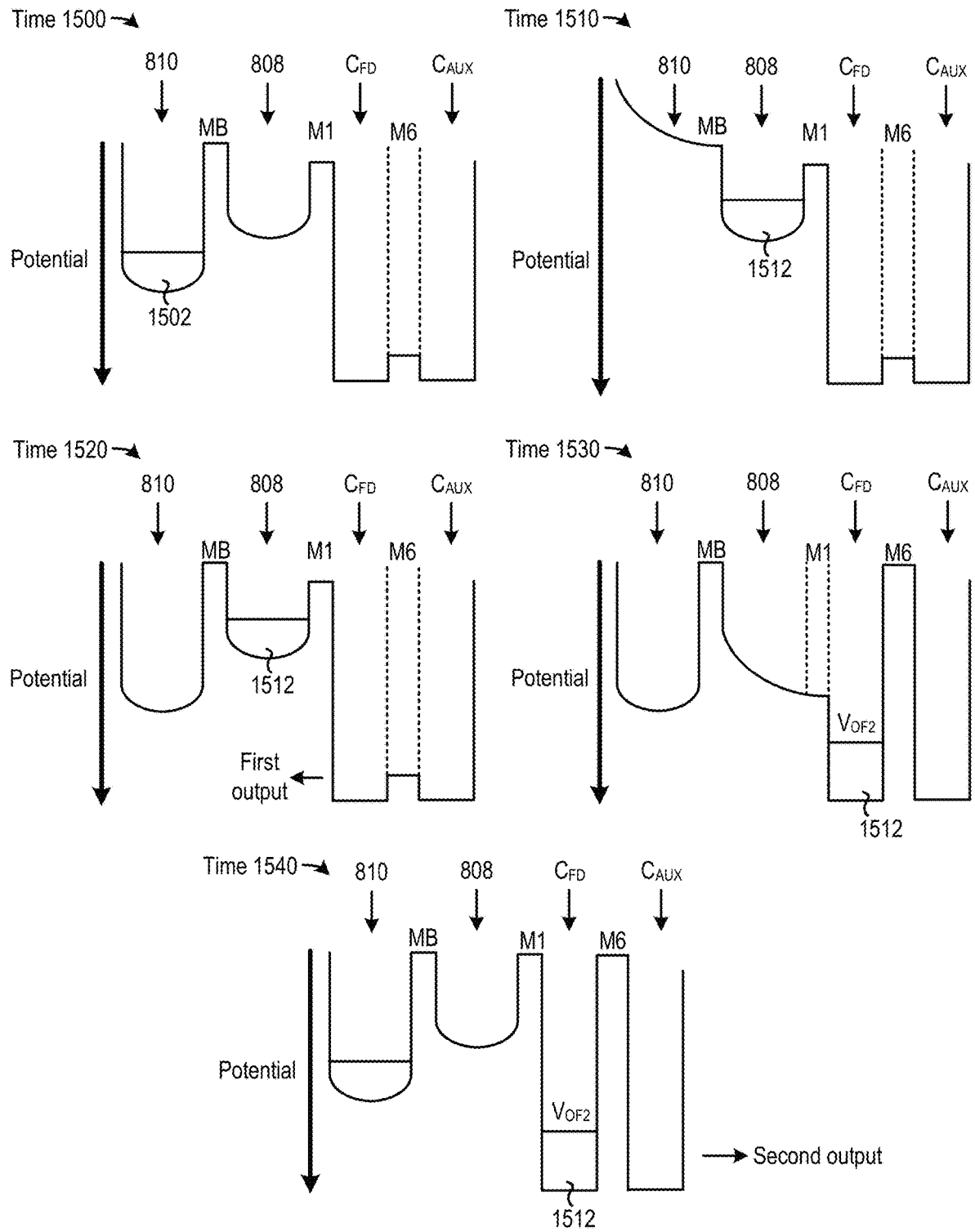
FIG. 15A and FIG. 15B illustrate example sequences of read out and quantization of charge from the pixel cell of FIG. 8.
Figure 15B:
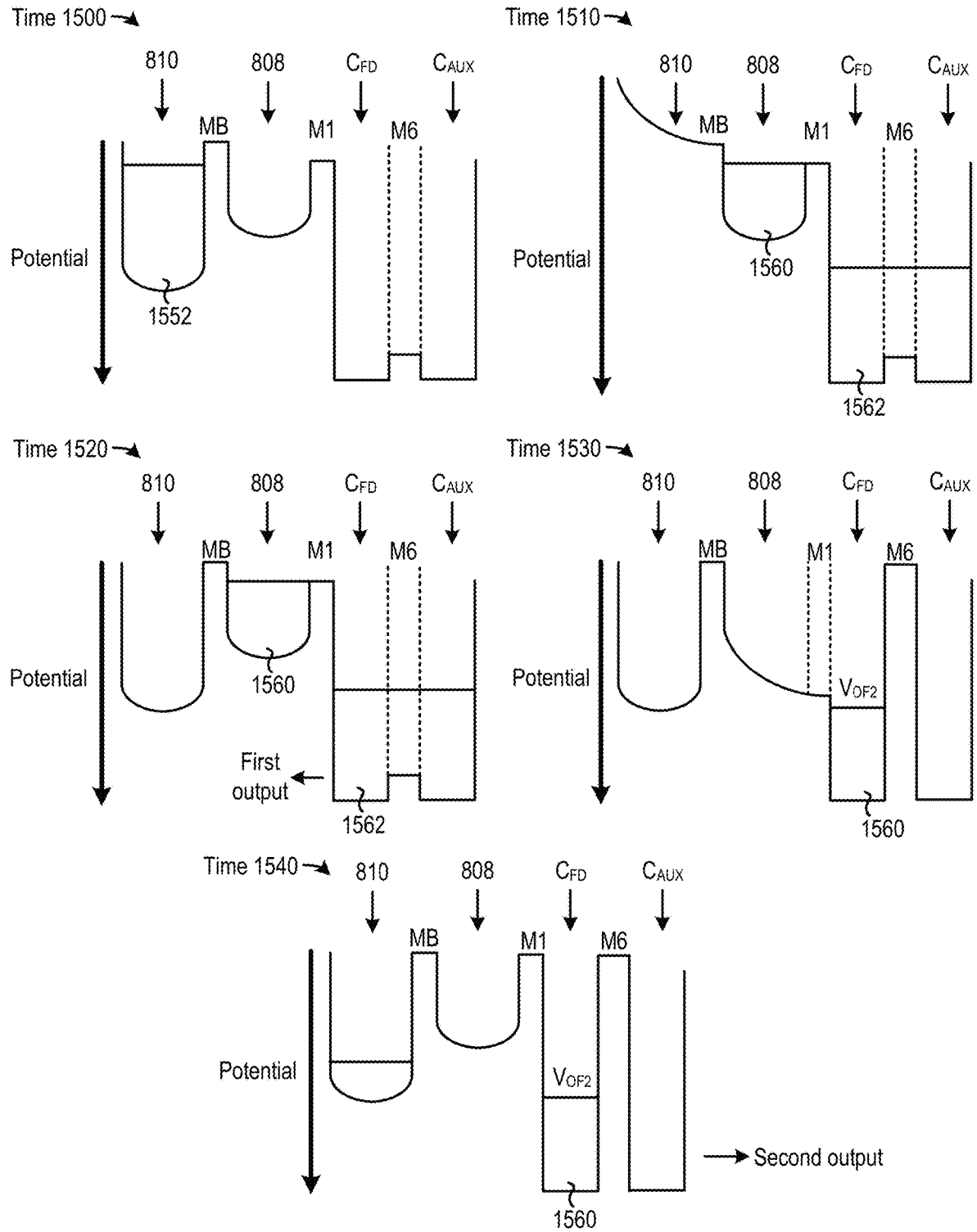

FIG. 15A and FIG. 15B illustrate example sequences of read out and quantization of second charge, as well as the corresponding distributions of electrical potentials among second photodiode 810, first photodiode 808, transfer switch M1, capacitors $C_{FD}$ and $C_{AUX}$, as well as control switch M6. FIG. 15A illustrates an example where the second charge does not saturate first photodiode 808, whereas FIG. 15B illustrates an example where the second charge saturates first photodiode 808. As shown in both FIG. 15A and FIG. 15B, the quantum well of second photodiode 810 can be larger than that of first photodiode 808.

Referring to FIG. 15A, at time 1500, second charge 1502 can be stored in second photodiode 810 at the end of the exposure period. First photodiode 808 and charge storage device 616 (comprising capacitors $C_{FD}$ and $C_{AUX}$) has been reset following the read out and quantization of first charge. MB switch is in the disabled state to prevent the second charge from flowing into first photodiode 808, and to prevent from the first charge from flowing into second photodiode 810.

At time 1510, the MB switch can be set in an enabled state by, for example, reducing the electrical potential of barrier layer 914 as in FIG. 10A, introducing a negative bias to first semiconductor substrate 802 as in FIG. 10B, etc. Second charge 1502 can be transferred from second photodiode 810 to first photodiode 808 and stored in first photodiode 808 as second residual charge 1512. Transfer switch M1 can be controlled by TG to be in a partially-on state to enable the quantum well of first capacitor 808 to hold second residual charge 1512. Moreover, the M6 control switch can be enabled to increase the capacitance of charge storage device 616 to store overflow charge from first capacitor 808, if any, from first photodiode 808 (none in FIG. 15A) for FD ADC measurement.

At time 1520, the MB switch can be set in the disabled state to isolate the residual charge 1512 in first photodiode 808, while transfer switch M1 remains in the partially-on state. ADC 1204 may perform the FD ADC measurement to generate a first output. ADC 1204 may also determine that no overflow charge is stored in charge storage device 616, and that second light component 824 is in the low intensity range.

At time 1530, charge storage device 616 can be reset. The capacitance of charge storage device 616 can be shrunk by disabling control switch M6 such that charge storage device 616 only includes the $C_{FD}$ capacitor, to increase the charge-to-voltage rate and to reduce the effect of quantization noise, as described above. Transfer switch M1 can be controlled by the TG signal to be in a fully-on state to transfer second residual charge 1512 to the $C_{FD}$ capacitor, which can output a $V_{OF2}$ voltage.

At time 1540, after the transfer of second residual charge 1512 completes, transfer switch M1 can be controlled by the TG signal to be in a fully-off state to isolate second residual charge 1512 within the $C_{FD}$ capacitor. ADC 1204 can measure second residual charge 1512 stored in the $C_{FD}$ capacitor in the PD ADC operation to generate a second output. ADC 1204 can also determine that second light component 824 is in the low intensity range, based on no overflow charge being stored in charge storage device 616 as determined at time 1520. Based on such a determination, ADC 1204 can provide the second output of the PD ADC operation, instead of the first output of the FD ADC operation, to represent the intensity of second light component 824.

FIG. 15B illustrates an example where the second charge saturates first photodiode 808. The configurations of the switches, the photodiodes, and charge storage device 616 at times 1500, 1510, 1520, 1530, and 1540 are identical to FIG. 15A and some of their descriptions are not repeated here.

Referring to FIG. 15B, at time 1500, second charge 1552 can be stored in second photodiode 810 at the end of the exposure period. The quantity of second charge 1552 is larger than the quantity of second charge 1502 in FIG. 15A and can saturate first photodiode 808.

At time 1510, second charge 1552 is transferred out of second photodiode 810 by enabling the MB switch. Part of second charge 1552 can be stored in first photodiode 808 as second residual charge 1560 and the rest of second charge 1552 can be stored in charge storage device 616 (having a combination of $C_{FD}$ capacitor and $C_{AUX}$ capacitor) as second overflow charge 1562.

At time 1520, ADC 1204 may perform the FD ADC measurement to generate a first output. In FIG. 15B, ADC 1204 may determine that second overflow charge 1562 is stored in charge storage device 616, and that second light component 824 is in the medium intensity range.

At time 1530, charge storage device 616 can be reset. The capacitance of charge storage device 616 can be shrunk. Second residual charge 1560 can be transferred to the $C_{FD}$ capacitor, which can output a $V_{OF2}$ voltage.

At time 1540, ADC 1204 can perform the PD ADC operation to measure second residual charge 1560 stored in the $C_{FD}$ capacitor to generate a second output. ADC 1204 can also determine that second light component 824 is in the medium intensity range, based on second overflow charge 1562 being stored in charge storage device 616 as determined at time 1520. Based on such a determination, ADC 1204 can provide the first output of the FD ADC operation instead of second output of the PD ADC operation to represent the intensity of second light component 824.

Figure 16:
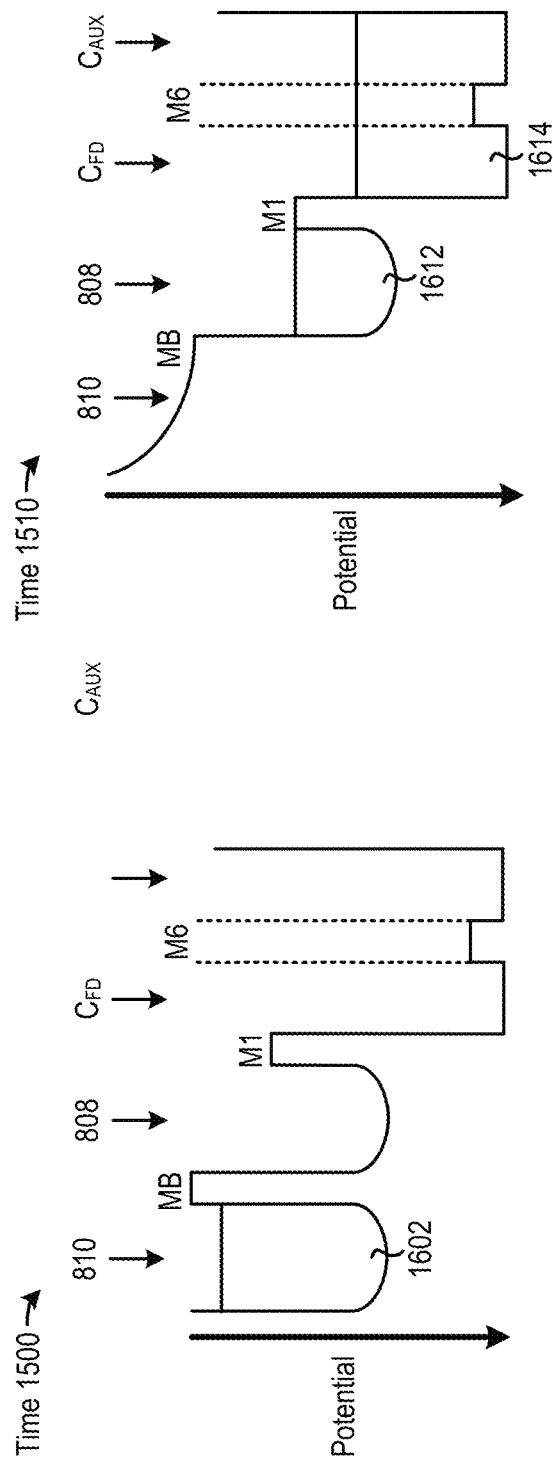
FIG. 16 illustrate example sequences of read out and quantization of charge from the pixel cell of FIG. 8.

In some examples, first photodiode 808 and second photodiode 810 may have the same (or substantially the same) quantum well capacities due to, for example, limitations of the fabrication process. In such examples, first photodiode 808 can be configured to have a smaller charge storage capacity based on controlling the bias voltage of channel region 922 (e.g., based on the TG signal provided to the transfer switch M1), the threshold voltage of channel region 922, etc., to control the maximum quantity of charge stored in first photodiode 808 before the charge leaks through transfer switch M1 to charge storage device 616. FIG. 16 illustrates an example of part of sequence of read out and quantization of second charge. At time 1500 of FIG. 16, second photodiode 810 may store second charge 1602, and barrier switch MB is in the disabled state to prevent second charge 1602 from flowing to first photodiode 808 and to prevent charge from flowing from first photodiode 808 to second photodiode 810. The level of TG signal provided to the transfer switch M1 to set the switch in the partially-on state can be lower than the level of TG signal in FIG. 15A and FIG. 15B, which reduces the storage capacity of first photodiode 808. In time 1510, the MB switch can be enabled, and second charge 1602 can be transferred to first photodiode 808. Part of second charge 1602 can be stored in first photodiode 808 as second residual charge 1612, the quantity of which being set based on the level of TG signal. The reset of second charge 1602 can be stored in charge storage device 616 as second overflow charge 1618. The subsequent read out and quantization operations can be similar to those at times 1520, 1530, and 1540 as described in FIG. 15B.

Figure 17A:
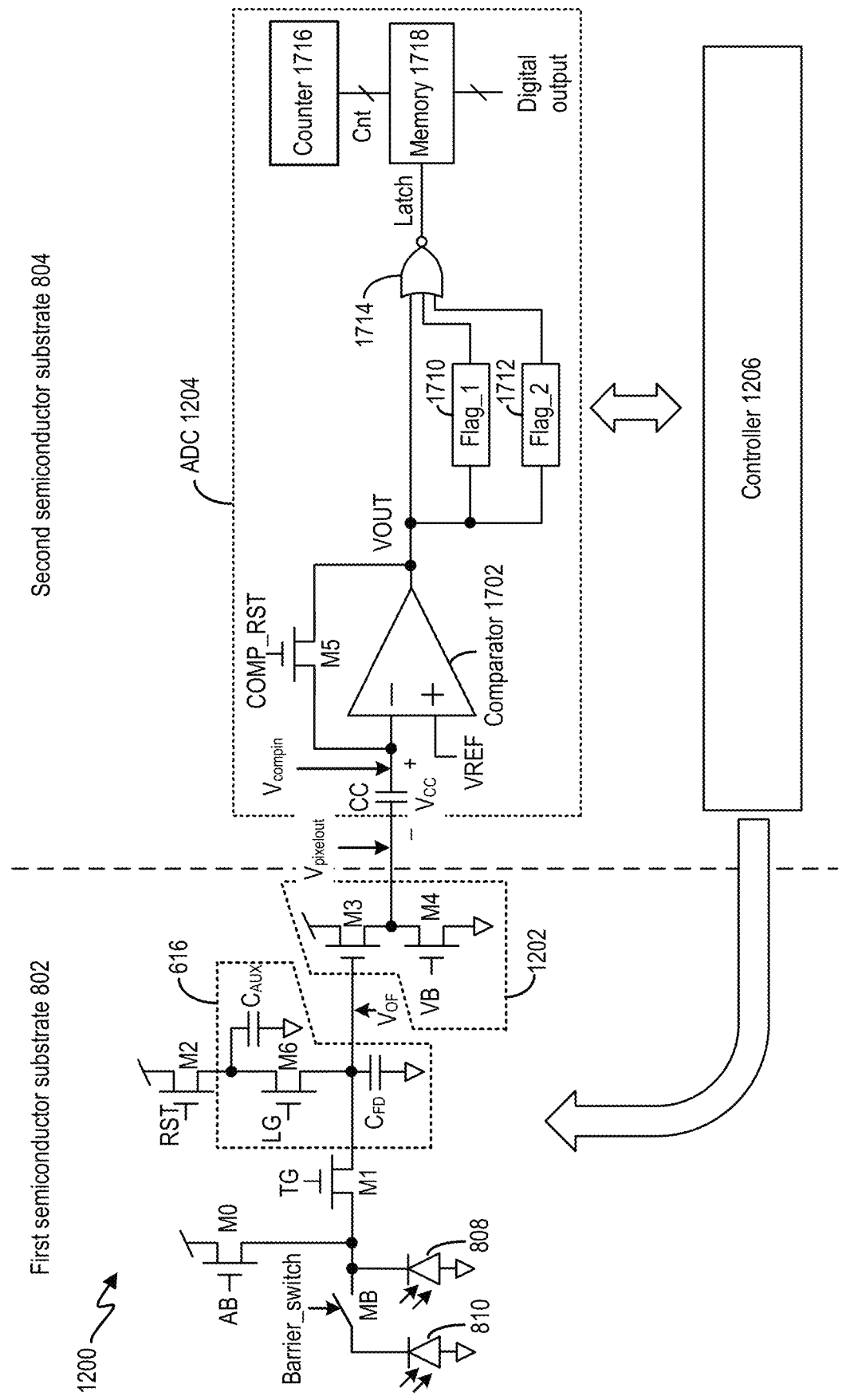
FIG. 17A and FIG. 17B illustrate example internal components of pixel cell of FIG. 8 and their operations.
Figure 17B:
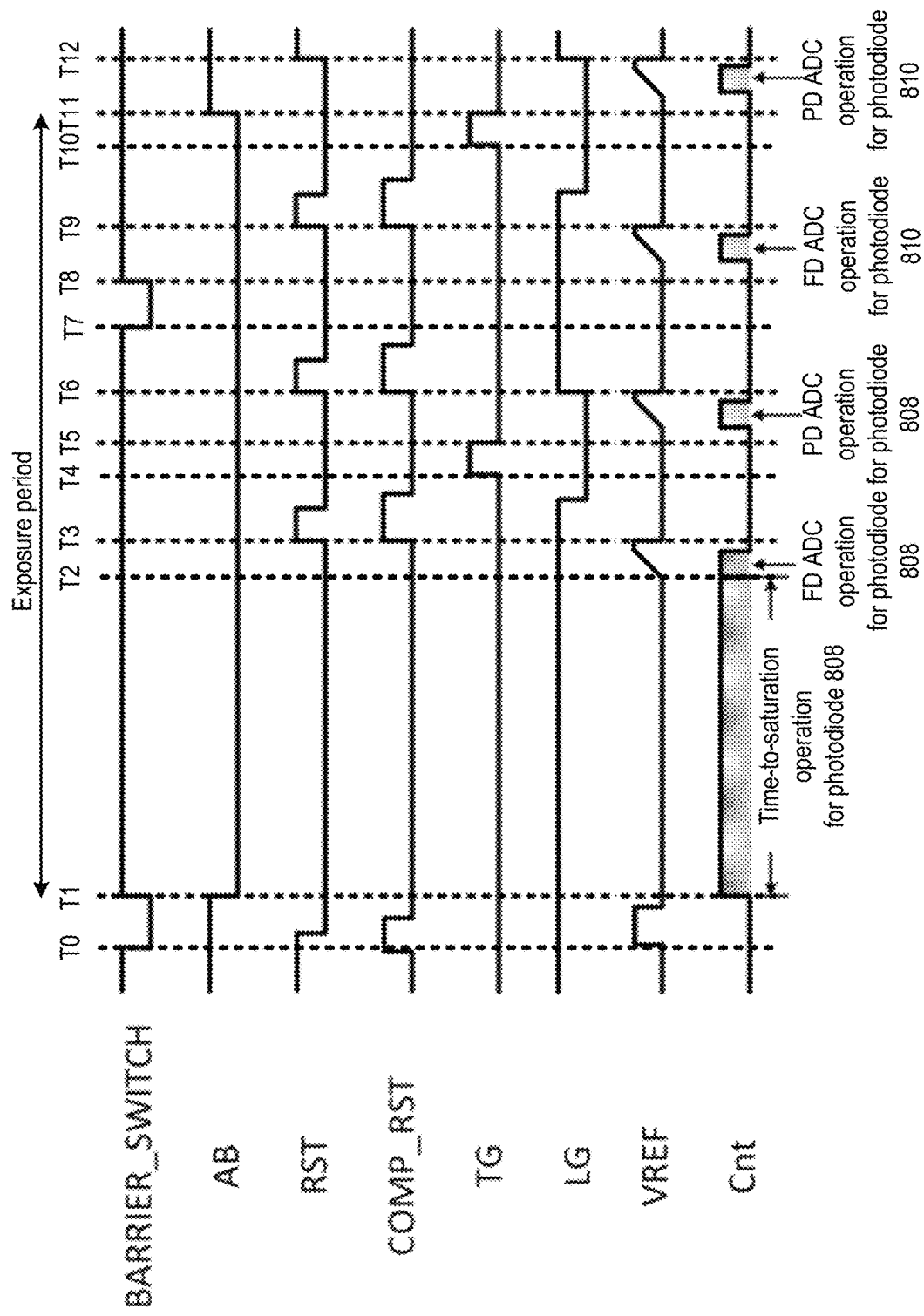

FIG. 17A illustrate examples of components of ADC 1204, whereas FIG. 17B and a sequence of control signals of pixel cell 800. As shown in FIG. 17A, ADC 1204 includes a CC capacitor, a resettable comparator 1702 which can be reset by comparator reset switch M5, registers 1710 and 1712, a NOR gate 1714, a counter 1716, and a memory 1718. The CC cap is configured as a sampling capacitor to generate a voltage $V_{compin}$ (at one input of comparator 1702) which tracks $V_{pixelout}$, and provides the $V_{compin}$ voltage to comparator 1702 to compare against VREF. VREF can be a static voltage for TTS measurement operation (for high light intensity range) or a ramping voltage for FD ADC and PD ADC operations (for low and medium light intensity ranges), as described above. The count values (labelled "cnt" in FIG. 17A) can be generated by counter 1716, which can be started at each of TTS, FD ADC, and PD ADC operation and which can update the count values periodically based on a clock. The comparison result (VOUT) generated by comparator 1702 can be fed to NOR gate 1714 to generate a latch signal to control memory 1718. When the $V_{compin}$ voltage crosses VREF, the VOUT signal can trip, and the latch signal trips as well. The tripping of the latch signal can cause memory 1718 to store the count value output by counter 1716 at the time of tripping. Depending on whether the measurement is performed on the first charge generated by first photodiode 808 or second photodiode 810, the count value stored in memory 1718 can be output as the digital representation of the intensity of first light component 822 or second light component 824. In some examples, counter 1716 and memory 1718 can be external to ADC 1204 and can be shared among multiple pixel cells.

ADC 1204 include features that can further improve the accuracy of the incident light intensity determination. For example, the combination of the CC capacitor, comparator reset switch M5, as well as reset switch M2, can be operated to compensate for measurement errors (e.g., comparator offset) introduced by comparator 1702, as well as other error signals such as, for example, reset noise introduced to charge storage device 616 by reset switch M2. Specifically, in a first sampling operation, M2 and M5 can be closed to, respectively, reset charge storage device 616 and comparator 1702. With charge storage device 616 reset, the CC capacitor can store noise charge introduced by the reset operation. Moreover, with M5 closed, the voltage of the negative terminal of comparator 1702 ($V_{compin}$) can track the voltage of the positive terminal of comparator 1702 but differ by the comparator offset. As a result, a quantity of noise charge reflecting the comparator offset as well as the reset noise can be stored at the CC capacitor to develop a voltage difference $V_{CC}$ across the CC capacitor, and $V_{CC}$ can include components representing the comparator offset and the reset noise.

In a second sampling operation, M2 and M5 can be opened so that charge storage device 616 and comparator 1702 can exit their respective reset states. Charge storage device 616 can receive charge from one of first photodiode 808 or second photodiode 810 as described above in FIG. 14, FIG. 15A, FIG. 15B, and FIG. 16 to develop $V_{OF}$, which can be buffered by buffer 1202 to generate the voltage $V_{pixelout}$. The reset noise charge introduced by reset switch M2 in the prior reset operation also remains in charge storage device 616, therefore $V_{pixelout}$ also includes the component of the reset noise. Through ac-coupling, a new $V_{compin}$ can be obtained, in which the new $V_{compin}$ tracks $V_{pixelout}$ based on the addition of $V_{CC}$. As $V_{CC}$ also contains the component of the reset noise, the reset noise component can be cancelled out in the new $V_{compin}$, which still includes the component of comparator offset. Comparator 1102 can compare the new $V_{compin}$ voltage against VREF to generate a decision (VOUT) to control a time when to store the output of counter 1716 at memory 1718, to quantize the quantity of charge stored at charge storage device 616. The comparator offset component in the new $V_{compin}$ can cancel out or substantially reduce the effect of the comparator offset of comparator 1702.

The first sampling operation and the second sampling operation can be part of the TTS measurement, FD ADC, and PD ADC operations for the first charge generated by first photodiode 808, as well as part of the FD ADC and PD ADC operations for the second charge generated by second photodiode 810. As both the comparator offset and reset noise are eliminated or at least substantially reduced, the accuracy of the quantization process can be improved.

The above-mentioned exposure of first photodiode 808 and second photodiode 810 to incident light, TTS, FD ADC, and PD ADC operations for the first charge of first photodiode 808, transfer of second charge from second photodiode 810 to first photodiode 808, as well as the FD ADC and PD ADC operations for the second charge of second photodiode 810, can be controlled by controller 1206. Controller 1206 may also include a DAC (not shown in FIG. 17A) which can generate VREF based on the count values (cnt) from counter 1716. In addition, controller 1206 can store prior decisions of comparator 1702 from the TTS and FD ADC operations (for the quantization of the first charge) and from the FD ADC operation (for the quantization of the second charge) at FLAG_1 register 1710 and FLAG_2 register 1712, and use the stored decisions to select the count value output of one of the TTS, FD ADC, or PD ADC operations to represent the incident light intensity, as to be explained below.

FIG. 17B illustrates an example sequence of control signals of pixel cell 800 provided by controller 1206 to perform multi-stage read out and quantization of first photodiode 808 and second photodiode 810. Referring to FIG. 17B, between time T0 and T1, controller 1206 can put pixel cell 800 in a reset state. As part of the reset state, the barrier switch signal can be de-asserted to enable barrier layer 914, to allow charge to flow between first photodiode 808 and second photodiode 810. The AB signal can be enabled to enable the shutter switch M0 and reset both first photodiode 808 and second photodiode 810. Moreover, controller 1206 can assert the RST signal to enable the reset switch M2 to reset charge storage device 616, and assert the COMP_RST signal to reset comparator 1702. Following the de-assertion of reset switch M2 and the COMP_RST signal, the reset noise and comparator offset information can be stored in the CC capacitor as part of the first sampling operation. Moreover, the LG signal can be asserted to maximize the charge storage capacity of charge storage device 616, while the TG signal can be set to bias transfer switch M1 at the partially-on state to set the residual charge storage capacity of first photodiode 808.

At time T1, controller 1206 can de-assert the AB signal to disable the shutter switch M0 to start the exposure period, in which both first photodiode 808 and second photodiode 810 can generate, respectively, first charge and second charge in response to first light component 822 and second light component 824.

Between times T1 and T2, first photodiode 808 may generate first charge and store part of the first charge as first residual charge while output the remaining first charge as first overflow charge to charge storage device 616. ADC 1204 can perform the TTS operation to detect the saturation of charge storage device 616 and its timing by comparing, using comparator 1702, $V_{compin}$ with a static VREF. If charge storage device 616 saturates, the comparator output can trip. At time T2, if the output of comparator 1702 indicates that charge storage device 616 saturates, memory 1718 can store the count value output by counter 1716 at time when the comparator output trips. Controller 1206 can also assert the FLAG 1 signal in register 1710 to indicate that charge storage device 616 saturates, which can prevent subsequent FD ADC and PD ADC operations from overwriting the stored count value in memory 1718.

Between T2 and T3, ADC 1204 can perform the FD ADC measurement to measure a quantity of the first overflow charge in charge storage device 616. ADC 1204 can perform the measurement based on comparing $V_{compin}$ with a ramping threshold to find the threshold that is closest to $V_{compin}$. As explained above, $V_{compin}$ can be obtained from a second sampling operation and can be based on a combination of $V_{pixelout}$ (buffered $V_{OF}$ voltage of charge storage device 616) and the $V_{CC}$ voltage across the CC capacitor. $V_{pixelout}$ represents the first overflow charge in charge storage device 616 and includes reset noise charge, whereas $V_{CC}$ includes the reset noise and comparator offset information. The combination cancels the reset noise and compensates for the offset of comparator 1702 when compared against VREF. The ramping threshold can be generated by a DAC based on count values from, for example, counter 1716 and can include a voltage range between threshold 1302 (which can correspond to saturation of first photodiode 808) and threshold 1304 (which can correspond to saturation of charge storage device 616). If charge storage device 616 stores first overflow charge, $V_{compin}$ crosses threshold 1302, and the output of comparator 1702 can trip. At time T3, if the output of comparator 1702 trips, and if FLAG_1 is de-asserted (which indicates that charge storage device 616 does not saturate during the TTS operation), memory 1718 can store the count value output by counter 1716 at the time when the output of comparator 1702 trips. Controller 1206 can also assert the FLAG_2 signal in register 1712 to indicate that charge storage device 616 stores first overflow charge, which can prevent the subsequent PD ADC operation from overwriting the stored count value in memory 1718.

Between times T3 and T4, charge storage device 616 and comparator 1702 are reset to prepare for the subsequent PD ADC operation. The reset noise and the comparator offset are also stored in the CC capacitor in the form of the $V_{CC}$ voltage. Moreover, the LG signal is de-asserted to disconnect $C_{AUX}$ from $C_{FD}$ to reduce the capacitance of charge storage device 616 and to increase to charge-to-voltage conversion rate for the subsequent PD ADC operation.

Between times T4 and T5, the TG signal is asserted to set the transfer switch M1 to the fully-on state, to transfer the first residual charge from first photodiode 808 to charge storage device 616. Between times T5 and T6, ADC 1204 can perform the PD ADC operation to measure a quantity of the first residual charge in charge storage device 616. ADC 1204 can perform the measurement based on comparing $V_{compin}$ with a ramping threshold to find the threshold that is closest to $V_{compin}$, and the count value corresponding to the closest threshold, at which point the output of comparator 1702 trips. Both reset noise and comparator offset are cancelled or at least substantially eliminated as in FD ADC. At time T6, if both FLAG_1 and FLAG_2 are de-asserted, which can indicate that there is no first overflow charge, the count value at the time when the output of comparator 1702 trips can be stored in memory 1718. The count value stored in memory 1718 at the time T6 can be provided as a digital output to represent the intensity of first light component 822.

Between times T6 and T7, charge storage device 616 and comparator 1702 are reset to prepare for the subsequent read out and quantization of second charge from second photodiode 810. The reset noise and the comparator offset are also stored in the CC capacitor in the form of the $V_{CC}$ voltage. Moreover, the LG signal is asserted to connect $C_{AUX}$ with $C_{FD}$ to increase the capacitance of charge storage device 616 for storage of overflow charge.

Between times T7 and T8, barrier_switch can be de-asserted to enable barrier layer 914, to allow second charge stored in second photodiode 810 to flow to first photodiode 808 for read out. The TG signal can set the transfer switch M1 at the partially-on state to set the residual charge storage capacity of first photodiode 810. The second charge can be entirely stored at first photodiode 808 as second residual charge, or part of the second charge can flow to charge storage device 616 as second overflow charge.

Between times T8 and T9, ADC 1204 can perform the FD ADC operation to measure a quantity of the second overflow charge in charge storage device 616. The FD ADC operation of the second overflow charge is identical to the FD ADC operation of the first overflow charge between times T2 and T3. If charge storage device 616 stores the second overflow charge, $V_{compin}$ crosses threshold 1302, and the output of comparator 1702 can trip. At time T9, if the output of comparator 1702 trips, memory 1718 can store the count value output by counter 1716 at the time when the output of comparator 1702 trips. Controller 1206 can also assert the FLAG_2 signal in register 1712 to indicate that charge storage device 616 stores first overflow charge, which can prevent the subsequent PD ADC operation from overwriting the stored count value in memory 1718. Meanwhile, as TTS operation is not performed on the second charge, the FLAG_1 signal in register 1712 can be de-asserted.

Between times T9 and T10, charge storage device 616 and comparator 1702 are reset to prepare for the subsequent PD ADC operation. The reset noise and the comparator offset are also stored in the CC capacitor in the form of the $V_{CC}$ voltage. Moreover, the LG signal is de-asserted to disconnect $C_{AUX}$ from $C_{FD}$ to reduce the capacitance of charge storage device 616 and to increase to charge-to-voltage conversion rate for the subsequent PD ADC operation.

Between times T10 and T11, the TG signal is asserted to set the transfer switch M1 to the fully-on state, to transfer the first residual charge from first photodiode 808 to charge storage device 616. The shutter switch M0 can also be enabled at time T11 to end the exposure period. Between times T11 and T12 ADC 1204 can perform the PD ADC operation to measure a quantity of the second residual charge in charge storage device 616. The PD ADC operation on the second residual charge can be identical to the PD ADC operation on the first residual charge between times T5 and T6. At time T12, if FLAG_2 is de-asserted, which can indicate that there is no second overflow charge, the count value at the time when the output of comparator 1702 trips can be stored in memory 1718. The count value stored in memory 1718 at the time T12 can be provided as a digital output to represent the intensity of second light component 824.

Figure 18:
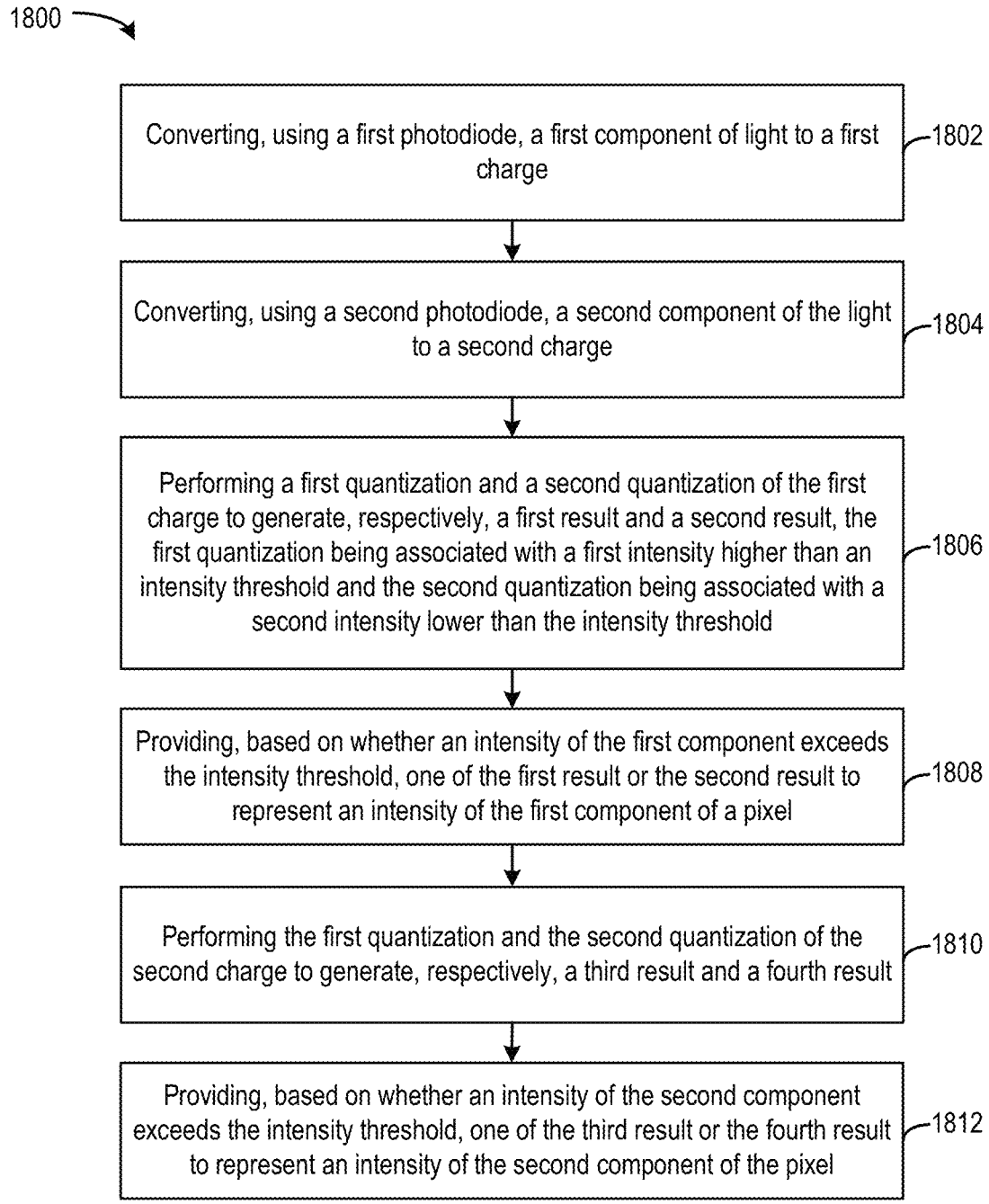
FIG. 18 illustrates a flowchart of an example method of measuring light intensity.

FIG. 18 is a flowchart of an example method 1800 of measuring light intensity. Method 1800 can be performed by, for example, pixel cell 800 and can be based on the techniques described above.

In step 1802, a first photodiode (e.g., first photodiode 808) can convert a first component of light (e.g., infra-red component of incident light 820) to a first charge. The first charge can be stored in the quantum well of the first photodiode as residual charge. In a case where the first photodiode saturates, part of the first charge can also be stored as overflow charge in a charge storage device (e.g., charge storage device 616) coupled with the first photodiode.

In step 1804, a second photodiode (e.g., second photodiode 810) can convert a second component of light (e.g., a color visible light component of incident light 820) to a second charge. The second charge can be stored in the quantum well of the second photodiode. Steps 1802 and 1804 can occur in parallel.

In step 1806, an ADC of the pixel cell (e.g., ADC 1204) can perform a first quantization and a second quantization of the first charge to generate, respectively, a first result and a second result, the first quantization being associated with a first intensity higher than an intensity threshold and the second quantization being associated with a second intensity lower than the intensity threshold. For example, the first quantization can be the aforementioned FD ADC process, in which the ADC can quantize the overflow charge (if any) stored in charge storage device 616. The ADC can also increase the storage capacity of charge storage device 616 for the FD ADC process. The first quantization can be performed by, for example, comparing the voltage at charge storage device 616 against a ramping voltage to generate a first decision, and the first decision can be used to stop a free running counter. The count value from the counter represent the first result. The ADC can also store a flag value (e.g., FLAG_2) based on the first decision to indicate whether overflow charge is detected in charge storage device 616, which indicates first photodiode is saturated due to the intensity of first light component being above the predetermined low intensity range (e.g., low intensity range 1306). The first result can be stored in a memory.

Following the first quantization, the ADC can perform the second quantization, which can be the aforementioned PD ADC process, in which the ADC can quantize the residual charge stored in charge storage device 616. The ADC can decrease the storage capacity of charge storage device 616 for the PD ADC process to increase the conversion gain and to reduce the quantization error. The second quantization can be performed by, for example, comparing the voltage at charge storage device 616 against a ramping voltage to generate a second decision, and the second decision can be used to stop the free running counter. The count value from the counter represent the second result.

In step 1808, the ADC can provide, based on whether an intensity of the first component exceeds the intensity threshold, one of the first result or the second result to represent an intensity of the first component of a pixel. Referring back to step 1806, based on the flag value of FLAG_2, the ADC may determine whether the first photodiode saturates, which indicates the intensity of the first light component exceeds the low intensity range. If the flag value indicates that the first photodiode does not saturate and the intensity of the first light component is within the low intensity range, the ADC can store the second result in the memory and provide the second result from the memory to represent the intensity of the first light component. If the FLAG_2 indicates that the intensity of the first light component exceeds the low intensity range, the ADC can discard the second result and provide the first result from the memory to represent the intensity of the first light component.

In step 1810, the ADC can perform the first quantization and the second quantization of the second charge to generate, respectively, a third result and a fourth result. In one example, the first photodiode and the second photodiode can form a stack structure. The first photodiode can be on the charge transfer path from the second photodiode to charge storage device 616, and a barrier layer (e.g., barrier layer 914) can be sandwiched between the first photodiode and the second photodiode to control the flow of the second charge. To perform the read out and quantization of the second charge, the electrical potential of the barrier layer can be varied (e.g., based on the techniques described in FIG. 10A-FIG. 11B and FIG. 14-FIG. 15B) to allow the second charge to flow from the second photodiode to the first photodiode. The second charge can be stored in the first photodiode as residual charge. Part of the second charge can also be stored in charge storage device 616 as overflow charge. The overflow charge and the residual charge can then be quantized by the ADC based on, respectively, the first quantization and the second quantization as described above to generate the third result and the fourth result. One of the third result or the fourth result can be stored in the memory, as described above.

In step 1812, the ADC can provide, based on whether an intensity of the second component exceeds the intensity threshold, one of the third result or the fourth result to represent an intensity of the second component of the pixel. For example, based on the FLAG_2 value, the ADC can determine whether the first photodiode is saturated by the second charge, which indicates that the intensity of the second light component exceeds the low intensity range. Based on whether the first photodiode is saturated, the ADC can then either output the third result from the memory to represent the intensity of the second light component, or overwrite the third result with the fourth result in the memory and output the fourth result from the memory to represent the intensity of the second light component.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
   a first photodiode configured to convert a first component of light to a first charge;
   a second photodiode configured to convert a second component of the light to a second charge; and
   an interface circuit configured to:
     perform a first quantization and a second quantization of the first charge to generate, respectively, a first result and a second result, the first quantization being associated with a first intensity higher than an intensity threshold and the second quantization being associated with a second intensity lower than the intensity threshold;
     provide, based on whether an intensity of the first component exceeds the intensity threshold, one of the first result or the second result to represent an intensity of the first component of a pixel;
     perform the first quantization and the second quantization of the second charge to generate, respectively, a third result and a fourth result; and
     provide, based on whether an intensity of the second component exceeds the intensity threshold, one of the third result or the fourth result to represent an intensity of the second component of the pixel.

2. The apparatus of claim 1, wherein the first photodiode and the second photodiode form a stack structure in a semiconductor substrate along an axis parallel with a direction of propagation of the light within the semiconductor substrate such that (a) the light traverses the second photodiode to reach the first photodiode, or (b) the light traverses the first photodiode to reach the second photodiode.

3. The apparatus of claim 2, further comprising a charge storage device coupled with the first photodiode;
   wherein the first photodiode is configured to store first residual charge, the first residual charge being a part of the first charge generated by the first photodiode;
   wherein the charge storage device is configured to store first overflow charge, the first overflow charge being a part of the first charge generated by the first photodiode if an intensity of the first component of the light exceeds the intensity threshold;
   wherein the first quantization is configured to measure a quantity of the first overflow charge; and wherein the second quantization is configured to measure a quantity of the first residual charge.

4. The apparatus of claim 3,
wherein the first photodiode is along a charge transfer path from the second photodiode to the charge storage device;
wherein the interface circuit is configured to control the second photodiode to transfer the second charge to the first photodiode to enable the first photodiode to store the second charge as second residual charge, and to enable the charge storage device to store a part of the second charge as second overflow charge if an intensity of the second component of the light exceeds the intensity threshold;
wherein the first quantization is configured to measure a quantity of the second overflow charge; and
wherein the second quantization is configured to measure a quantity of the second residual charge.

5. The apparatus of claim 4, wherein the semiconductor substrate includes a barrier layer sandwiched between the first photodiode and the second photodiode to control a flow of charge from the second photodiode to the first photodiode.

6. The apparatus of claim 5, wherein the barrier layer is configured to control the flow of charge from the second photodiode to the first photodiode based on at least one of: a first bias voltage applied to the barrier layer, or a second bias voltage applied to the semiconductor substrate.

7. The apparatus of claim 4, wherein the first photodiode is configured to store a first maximum quantity of the first residual charge;
wherein the second photodiode is configured to store a second maximum quantity of the second residual charge; and
wherein the second maximum quantity is larger than the first maximum quantity.

8. The apparatus of claim 7, wherein the second maximum quantity is configured based on a maximum intensity of the second component of the light to be measured by the apparatus.

9. The apparatus of claim 7, wherein:
the first photodiode is configured to have a first quantum well capacity;
the second photodiode is configured to have a second quantum well capacity larger than the first quantum well capacity;
the first maximum quantity is configured based on the first quantum well capacity; and
the second maximum quantity is configured based on the second quantum well capacity.

10. The apparatus of claim 7, wherein the second maximum quantity is configured based on an electrical potential applied to the semiconductor substrate.

11. The apparatus of claim 1, wherein the apparatus is a back-side illuminated device;
wherein the first component of the light is within an infra-red wavelength range; and
wherein the second component of the light is within a visible light wavelength range.

12. The apparatus of claim 1, wherein the apparatus is a front-side illuminated device;
wherein the first component of the light is within a visible light wavelength range; and
wherein the second component of the light is within an infra-red wavelength range.

13. The apparatus of claim 4, wherein the interface circuit further comprises:

a counter configured to output count values based on a clock signal;
a comparator configured to compare a voltage of the charge storage device against one or more thresholds to generate a decision, the one or more thresholds being based on the intensity threshold; and
a memory coupled with the counter and with the comparator, the memory being controlled based on the decision of the comparator to store a count value from the counter; and
wherein the first result, the second result, the third result, and the fourth result are generated based on the stored count value.

14. The apparatus of claim 13, wherein the interface circuit is configured to perform the first quantization comprising:
comparing, using the comparator, a first voltage at the charge storage device with a first ramping threshold of the one or more thresholds to generate a first decision indicative of whether the charge storage device stores the first overflow charge or the second overflow charge; and
based on the first decision, controlling the memory to store a first count value from the counter as the first result of the first quantization of the first charge or as the third result of the first quantization of the second charge.

15. The apparatus of claim 14, wherein the interface circuit is configured to perform the second quantization comprising:
transferring the first residual charge or the second residual charge from the first photodiode to the charge storage device to develop a second voltage at the charge storage device;
comparing, using the comparator, the second voltage with a second ramping threshold of the one or more thresholds to generate a second decision; and
based on the second decision, and based on the first decision indicating that the charge storage device does not store the first overflow charge nor the second overflow charge, controlling the memory to store a second count value from the counter as the second result of the second quantization of the first charge or as the fourth result of the second quantization of the second charge.

16. The apparatus of claim 15, wherein the interface circuit is configured to, prior to the first quantization:
compare, using the comparator, the first voltage with a static threshold of the one or more thresholds to generate a third decision indicative of whether the first overflow charge saturates the charge storage device; and
based on the third decision indicating that the first overflow charge saturates the charge storage device:
measure, based on a third count value from the counter, a time-to-saturation of the charge storage device;
control the memory to store the third count value;
control the memory not to store the first count value or the second count value; and
provide the third count value stored in the memory to represent the intensity of the first component of a pixel.

17. The apparatus of claim 1, wherein the first photodiode and the second photodiode are pinned photodiodes.

18. A method comprising:
converting, using a first photodiode, a first component of light to a first charge;

converting, using a second photodiode, a second component of the light to a second charge;

performing a first quantization and a second quantization of the first charge to generate, respectively, a first result and a second result, the first quantization being associated with a first intensity higher than an intensity threshold and the second quantization being associated with a second intensity lower than the intensity threshold;

providing, based on whether an intensity of the first component exceeds the intensity threshold, one of the first result or the second result to represent an intensity of the first component of a pixel;

performing the first quantization and the second quantization of the second charge to generate, respectively, a third result and a fourth result; and providing, based on whether an intensity of the second component exceeds the intensity threshold, one of the third result or the fourth result to represent an intensity of the second component of the pixel.

19. The method of claim 18, wherein the first photodiode and the second photodiode are pinned photodiodes.

20. The method of claim 18, wherein the first photodiode and the second photodiode form a stack structure in a semiconductor substrate along an axis parallel with a direction of propagation of the light within the semiconductor substrate such that (a) the light traverses the second photodiode to reach the first photodiode, or (b) the light traverses the first photodiode to reach the second photodiode.

* * * * *